(12) United States Patent
Sato

(10) Patent No.: US 7,365,494 B2
(45) Date of Patent: Apr. 29, 2008

(54) DISPLAY DEVICE AND MANUFACTURING METHOD THEREOF

(75) Inventor: Mizuki Sato, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 329 days.

(21) Appl. No.: 11/287,078

(22) Filed: Nov. 22, 2005

(65) Prior Publication Data
US 2006/0181221 A1    Aug. 17, 2006

(30) Foreign Application Priority Data
Dec. 3, 2004    (JP) ............................. 2004-351926

(51) Int. Cl.
    *G09G 3/10* (2006.01)
(52) U.S. Cl. ............... 315/169.3; 313/495; 313/498; 313/503; 257/72
(58) Field of Classification Search ............ 315/169.3, 315/169.2, 169.1; 313/495, 497, 498, 503; 257/59, 72
See application file for complete search history.

(56) References Cited

U.S. PATENT DOCUMENTS

| | | | |
|---|---|---|---|
| 6,072,450 A * | 6/2000 | Yamada et al. ............... | 345/76 |
| 6,320,325 B1 | 11/2001 | Cok et al. ................. | 315/169.3 |
| 6,445,005 B1 | 9/2002 | Yamazaki et al. ............. | 257/72 |
| 6,528,951 B2 | 3/2003 | Yamazaki et al. ........ | 315/169.3 |
| 6,593,691 B2 | 7/2003 | Nishi et al. .................. | 313/506 |
| 2001/0030511 A1 | 10/2001 | Yamazaki et al ............ | 315/160 |
| 2001/0033252 A1 | 10/2001 | Yamazaki et al. ............. | 345/7 |
| 2005/0012731 A1 | 1/2005 | Yamazaki et al. .......... | 345/204 |
| 2005/0017963 A1 | 1/2005 | Yamazaki et al. .......... | 345/204 |
| 2005/0017964 A1 | 1/2005 | Yamazaki et al. .......... | 345/204 |

FOREIGN PATENT DOCUMENTS

JP    2002-333861    11/2002

* cited by examiner

*Primary Examiner*—David H. Vu
(74) *Attorney, Agent, or Firm*—Cook, Alex, McFarron, Manzo, Cummings & Mehler, Ltd.

(57) ABSTRACT

A display device in which a light shielding film is formed so as not to increase the number of steps and its cost, is provided. The display device of the present invention includes a monitor element for controlling influence on a light-emitting element due to temperature change and change with time and a TFT for driving the monitor element, and the TFT for driving the monitor element is provided so as not to be overlapped with the monitor element. The display device of the present invention includes a first light shielding film provided so as not to be overlapped with a first electrode of the monitor element, and a second light shielding film provided so as to be overlapped with an outer edge portion of the first electrode.

32 Claims, 12 Drawing Sheets

Emitting direction of light

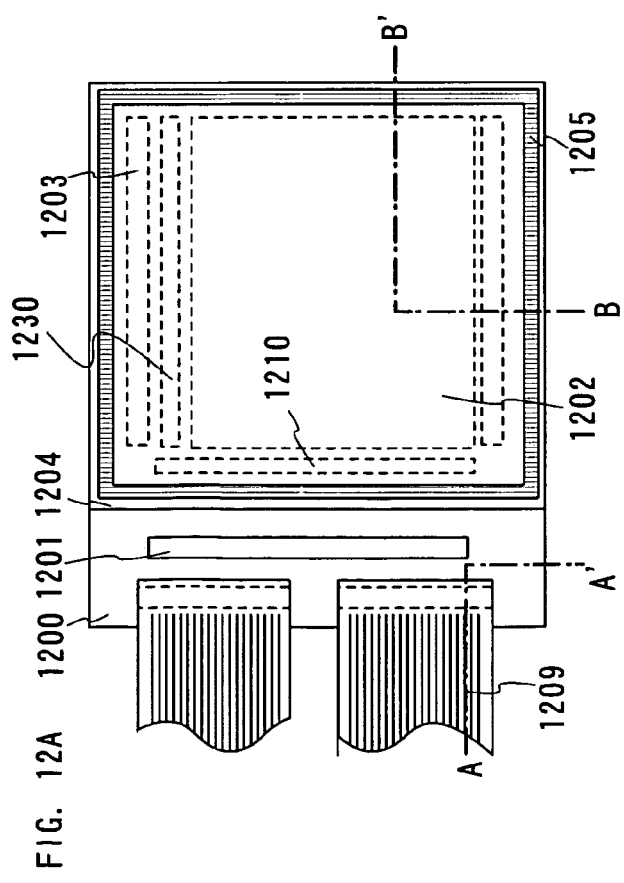
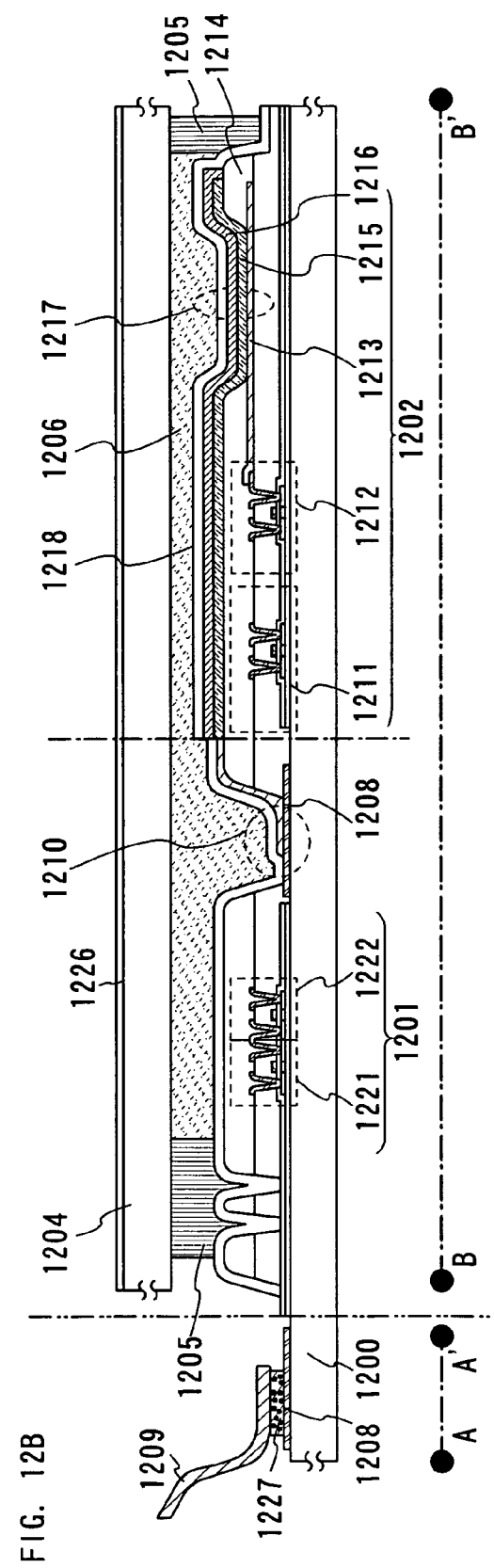
FIG. 12A
FIG. 12B

DISPLAY DEVICE AND MANUFACTURING METHOD THEREOF

FIELD OF THE INVENTION

The present invention relates to a display device using a semiconductor element (an element using a semiconductor thin film). In particular, the present invention relates to a display device using an electroluminescence (Electro Luminescence: EL) element and a thin film transistor (hereinafter, abbreviated as a "TFT"). Furthermore, the present invention relates to electronic devices in which a display device is used in a display portion.

BACKGROUND OF THE INVENTION

Attention has been given to a so-called self-luminous display device in which a pixel is formed of a light-emitting element such as a light-emitting diode (LED). As the light-emitting element used in such a self-luminous display device, an organic light-emitting diode (OLED) (also referred to as an organic EL element, an electroluminescence (EL) element) has attracted attention, and is used for an organic EL display, and the like.

Since the EL element is a self-luminous light-emitting element which has an electroluminescent layer between a pair of electrodes and which emits light by applying current between the electrodes, it has an advantage that visibility of a pixel is higher than that of a liquid crystal display, backlight is not needed, and response speed is high. Luminance of the light-emitting element is controlled by a current value flowing to the element.

The light-emitting element has properties in which a resistance value (internal resistance value) is changed by an environmental temperature (ambient temperature). In particular, when a room temperature is to be a normal temperature, the resistance value is decreased as the temperature becomes higher than the normal temperature, and the resistance value is increased as the temperature becomes lower than the normal temperature. Therefore, in a constant voltage drive, when the temperature becomes high, a current value is increased and higher luminance than desired luminance is obtained, and when the temperature becomes low, a current value is decreased and lower luminance than desired luminance is obtained. The light-emitting element which has been used in these days has properties in which a current value is decreased with time even if a predetermined voltage is applied.

Due to the properties of the light-emitting element mentioned above, variation in luminance is generated when the ambient temperature is changed and temporal change is occurred. In order to solve the problem of luminance variation in a light-emitting element due to the ambient temperature change and temporal change, it is proposed to provide a monitor element (for example, refer to patent document 1). One of the electrodes of the monitor element is connected with a constant-current source and an input of an amplifier (an input terminal), and an output of the amplifier (an output terminal) is connected with one of the electrodes of a light-emitting element provided for a pixel in a pixel portion. According to the structure, the current flowing through the light-emitting element of the pixel is kept constant based on temperature properties of the monitor light-emitting element. In this specification, "connected" means not only a direct connection but also an electrical connection. Thus, other elements and wirings may be formed between objects to be connected. In this specification, "overlap" means not only the case when elements constituting a display device are directly overlapped with each other, but also the case when the elements are overlapped with other elements interposed therebetween.

Patent document 1—Japanese Patent Laid-Open No. 2002-333861

According to the above structure, current flowing into the light-emitting element of the pixel can be kept constant even if the temperature of the light-emitting element (electroluminescent layer) is changed. Accordingly, the power consumption of the display device can be prevented from increasing even if the ambient temperature of the display device is increased, and luminance can also be kept constant.

Since the monitor element is not used in image display, a region provided with the monitor element (monitor element portion) is required to prevent light-transmittance of light generated from the monitor element. As a method for solving light leakage, there is a method to provide a light shielding film. Further, there is a method to provide projections on a reflecting surface of a cathode (a surface being in contact with the side of a light-emitting layer) of the monitor element and to scatter reflected light at the reflecting surface of the cathode.

The example of a structure of a light shielding film provided in a monitor element portion is described with reference to FIGS. 1 and 2. FIG. 1 is a layout of the monitor element portion, and FIG. 2 is a diagram showing a cross sectional structure when taken along a chained line A-A' in FIG. 1. Although the same monitor element portion as FIG. 1A is shown in FIG 1B, a first electrode 207 is omitted in a region shown as a reference number 212, and a current supply line 202, a light shielding film 214, and a drain electrode 215 are omitted in a region shown as a reference number 213, so as to give a simplified explanation on the location of the TFT for driving the monitor element and the like.

As shown in FIG. 1 and FIG. 2, in the monitor element portion, each of the region surrounded by a control line 201 which provides electric potential to a gate wiring of a TFT 211 for driving a monitor element and a gate wiring 206, is provided with a monitor element including a first electrode (an anode or a cathode), an electroluminescent layer 208, and a second electrode (a cathode or an anode) 209, and a TFT for driving the monitor element. Note that the gate wiring 206 is connected with a gate wiring provided in a pixel portion. A region 204 surrounded by dotted lines in FIG. 1 and FIG. 2 shows a region where a monitor element including an anode, an electroluminescent layer, and a cathode emits light. The gate wiring 205 of a TFT for driving the monitor element is overlapped with a first electrode 207 of the monitor element portion. Further, the TFT 211 is formed in the region surrounded by the control line 201 and the gate wiring 206, and the gate electrode 205 of the TFT 211 is formed over the same layer as a light shielding film 203, the light shielding film 203 is required to be formed so as not to overlap with the TFT 211. Therefore, it has been difficult to form the light shielding film 203 with an adequate size and shape to block the light. As a result, light generated from the monitor element is leaked from an aperture between the TFT 211 and the light shielding film 203. Furthermore, light is also leaked from a region which corresponds to an aperture between the current supply line 202 which connects the source region of a TFT for driving the monitor element and a constant current source, and the control line 201 which supplies electric potential to the gate wiring of the TFT for driving the monitor element. In FIG. 2, a reference numeral 210 is an interlayer insulating film, and 211 is an insulating film (referred to as a bank, a partition, a barrier, a mound, or the like).

This light leakage can be prevented by lowering the aperture ratio of the monitor element portion. However, the aperture ratio of the monitor element portion and that of a pixel portion are desirably at a comparable level in view of deterioration properties of a light-emitting element. Thus, it is not desirable to lower the aperture ratio of the monitor element portion for an original purpose to compensate the temperature of the light-emitting element of the pixel portion and deterioration thereof.

It is an object of the present invention to provide a display device in which a light shielding film without increasing the number of steps and causing high cost is formed.

SUMMARY OF THE INVENTION

A display device of the present invention includes a monitor element for controlling influence due to temperature change and temporality change of a light-emitting element and a TFT for driving the monitor element, and the monitor element and the TFT for driving the monitor element are provided in different regions from one another. Namely, the TFT for driving the monitor element is provided so as not to overlap with the monitor element. Furthermore, the display device of the present invention includes a first light shielding film provided so as to overlap with a first electrode of the monitor element and a second light shielding film which overlaps with the outer edge portion of the first electrode. Note that "monitor element portion" in this specification refers to a whole region provided with a monitor element.

A display device having a light-emitting element to which the present invention is applicable is an active matrix type. Further, as a method for emitting light from the light-emitting element, a bottom emission type or a dual emission type is applicable.

The first light shielding film is formed at the same time and under the same manufacturing condition as a gate signal line of the monitor element and a gate signal line of the light-emitting element provided in a pixel portion, and the second light shielding film is formed at the same time and under the same manufacturing condition as a source signal line of the monitor element and a source signal line of the light-emitting element provided in the pixel portion.

The display device of the present invention includes a plurality of pixels, a source signal line driver circuit, and a gate signal line driver circuit. Each of the plurality of the pixels includes a light-emitting element, a first transistor controlling an input of a video signal to the pixel, a second transistor controlling lighting or non-lighting of the light-emitting element, and a capacitor element holding a video signal. The capacitor element is not necessarily provided, and a gate capacitance of the second transistor can be used as a substitute for the capacitor element.

The monitor element portion (a region provided with a monitor element) may be placed in a pixel portion or other than the inside of the pixel portion. However, in order not to influence on image display and to put the monitor element portion in the same environment as the light-emitting element of the pixel portion, the monitor element portion is desirably provided to be closed to the region other than the pixel portion.

Further, the number of monitor elements can be properly selected. That is, a structure with one monitor element or a plurality of elements is acceptable. When only one monitor element is used, power consumption can be reduced since the current value to be applied to a constant current source is set to be a current value to be applied to the light-emitting element of each pixel. Furthermore, variation in properties of each monitor element can be averaged when more than one monitor elements are provided.

When using a panel including a light-emitting element for color display, an electroluminescent layer having a different light-emitting wavelength range is preferably provided to each pixel. Typically, an electroluminescent layer corresponding to each color of red (R), green (G), or blue (B) is preferably provided. In this case, a monitor element each corresponding to red, green, and blue is provided so that power supply voltage can be corrected with respect to each color. In this case, a structure in which a monitor element is provided for each color may be applied; preferably, a structure in which more than one element is provided for each color is applied.

An active matrix type display device disclosed in this specification includes a pixel portion in which a plurality of pixels each having a light-emitting element and a first thin film transistor for driving the light-emitting element are arranged in matrix, a monitor element having a first electrode, an electroluminescent layer over the first electrode, and a second electrode over the electroluminescent layer, a second thin film transistor for driving the monitor element, a constant current source for applying a constant current to the monitor element, and an amplifier, wherein the constant current source is electrically connected to one of the source and the drain of the second thin film transistor and an input of the amplifier; the other one of the source and the drain of the second thin film transistor is connected to one of the electrodes of the monitor element electrically; one of the electrodes of the light-emitting element is connected to an output of the amplifier with the first thin film transistor therebetween; the monitor element and the second thin film transistor are provided so as not to be overlapped with each other; a first light shielding film is provided so as to overlap with the first electrode of the monitor element; and a second light shielding film is provided so as to overlap with an edge of the first electrode of the monitor element.

An active matrix type display device disclosed in this specification includes, over an insulating substrate, a pixel portion provided with a plurality of pixels each having a light-emitting element and a first thin film transistor for driving the light-emitting element in matrix, a monitor element having a first electrode, an electroluminescent layer over the first electrode, and a second electrode over the electroluminescent layer, a second thin film transistor for driving the monitor element, a constant current source for applying a constant current to the monitor element, and a monitor element portion including an amplifier, wherein the constant current source is electrically connected to one of a source and a drain of the second thin film transistor and an input of the amplifier; the other one of the source and the drain of the second thin film transistor is connected to one of the electrodes of the monitor element electrically; one of the electrodes of the light-emitting element is connected to an output of the amplifier with the first thin film transistor therebetween; the monitor element portion is provided with a first light shielding film formed with the same material as a gate signal line, an interlayer insulating film formed over the first light shielding film, a second light shielding film formed with the same material as a source signal line and formed over the interlayer insulating film, the first electrode formed over the interlayer insulating film and the second light shielding film, and the electroluminescent layer formed over the first electrode, and the second electrode formed over the electroluminescent layer; the monitor element and the second thin film transistor are provided in different regions from one another with the gate line therebetween; the first light shielding film is overlapped with the first electrode with the interlayer insulating film therebetween; and the second light shielding film is overlapped with an edge of the first electrode.

An active matrix type display device disclosed in this specification includes a pixel portion provided with a plurality of pixels over an insulating substrate, a source signal line driver circuit, a gate signal line driver circuit, and a monitor element portion, wherein each of the plurality of the pixels includes a light-emitting element having a pair of electrodes, a first thin film transistor for driving the light-emitting element, a source signal line into which a signal from the gate signal line driver circuit is inputted, and a gate signal line into which a signal from the gate signal line driver circuit is inputted; the monitor element portion includes a first light shielding film formed of the same material as the gate signal line, an interlayer insulating film formed over the first light shielding film, a second light shielding film formed of the same material as the source signal line and formed over the interlayer insulating film, a monitor element having a first electrode formed over the interlayer insulating film and the second light shielding film, an electroluminescent layer formed over the first electrode, and a second electrode formed over the electroluminescent layer, a second thin film transistor driving the monitor element, a constant current source applying a constant current to the monitor element, and amplifier; the constant current source is electrically connected to one of a source and a drain of the second thin film transistor and an input of the amplifier; the other one of the source and the drain of the second thin film transistor is connected to one of the electrodes of the monitor element; one of the electrodes of the light-emitting element is connected to an output of the amplifier electrically with the first thin film transistor therebetween; the monitor element and the second thin film transistor are provided in different regions from each other with the gate signal line therebetween; the first light shielding film is overlapped with the first electrode with the interlayer insulating film therebetween; and the second light shielding film is overlapped with an edge of the first electrode.

In the active matrix type display device, the second light shielding film has an annular shape.

In the active matrix type display device, the display device is a bottom emission display device or a dual emission display device.

In the active matrix type display device, the amplifier is a voltage-follower.

In the active matrix type display device, the monitor element and the TFT for driving the monitor element is provided close to the pixel portion.

In the active matrix type display device, the pixel portion has a plurality of pixels emitting red (R), pixels emitting green (G), and pixels emitting blue (B), and the monitor element and the thin film transistor for driving the monitor element are provided for each emission color.

In the active matrix type display device, the monitor element and the light-emitting element are EL elements.

In the active matrix type display device, the monitor element is formed with the same material and in the same step as the light-emitting element.

The active matrix type display device is incorporated into a television apparatus, a camera, a goggle type display, a navigation system, a sound reproducing device, a computer, a game machine, a mobile computer, a cellular phone, a portable game machine, a portable electronic book, or an image reproducing device including a recording medium.

A method for manufacturing an active matrix type display device disclosed in this specification includes the steps of:
  forming a base film over a substrate;
  forming a semiconductor layer over the base film, forming a gate insulating film over the semiconductor layer, forming a gate electrode over the gate insulating film, forming a source region and a drain region by adding an impurity into the semiconductor layer using the gate electrode as a mask to form a thin film transistor for driving a monitor element;
  forming a first light shielding film over the base film;
  forming an interlayer insulating film over the gate insulating film, the gate electrode, and the first light shielding film;
  forming a source electrode and a drain electrode each of which is connected to the source region and the drain region over the interlayer insulating film respectively;
  forming a second light shielding film over the interlayer insulating film; and
  forming a monitor element over the interlayer insulating film by forming a first electrode so as to overlap with the first light shielding film with the interlayer insulating film therebetween, forming an electroluminescent layer over the first electrode, and forming a second electrode over the electroluminescent layer,
  the gate electrode is formed in the same step as the first light shielding film;
  the source electrode and the drain electrode are formed in the same step as the second light shielding film;
  the edge of the first electrode is overlapped with the second light shielding film; and
  the monitor element is formed so as not to overlap with a thin film transistor for driving the monitor element.

In the present invention, in a region provided with a monitor element (a monitor element portion), the region with the monitor element and the region with a thin film transistor for driving the monitor element are different from each other. Namely, the thin film transistor for driving the monitor element is not overlapped with the monitor element. And, a first light shielding film is formed using a conductive film used for forming a gate electrode of a TFT for driving the monitor element and a gate signal line. Further, a second light shielding film is formed using a conductive film used for forming a source signal line. By forming two light shielding films in this manner, a light shielding film with high reliability can be formed without increasing the number of steps. Furthermore, a display device with high yield and high reliability can be provided at low cost.

BRIEF DESCRIPTION OF THE DRAWINGS

FIGS. 12A is a top view and FIG. 12B is a cross sectional view showing a structure of a display device of the present invention.

DETAILED DESCRIPTION OF THE PRESENTLY PREFERRED EMBODIMENTS

The best modes for carrying out the invention are described with reference to drawings. However, the present invention is not limited to the following description and it is easily understood by those of ordinary skill in the art that the modes and the detail can be changed variously unless otherwise such changes and modifications depart from the scope of the present invention. Therefore, the present invention does not limit an interpretation to the description of embodiment modes described below. Note that in a structure of the invention described below, the same symbol is commonly used in a different drawing showing an identical portion and a portion having the same function, and the repeated description is omitted.

Embodiment Mode 1

In this embodiment mode, features of a light shielding film provided in a monitor element portion are described.

Figure 3:
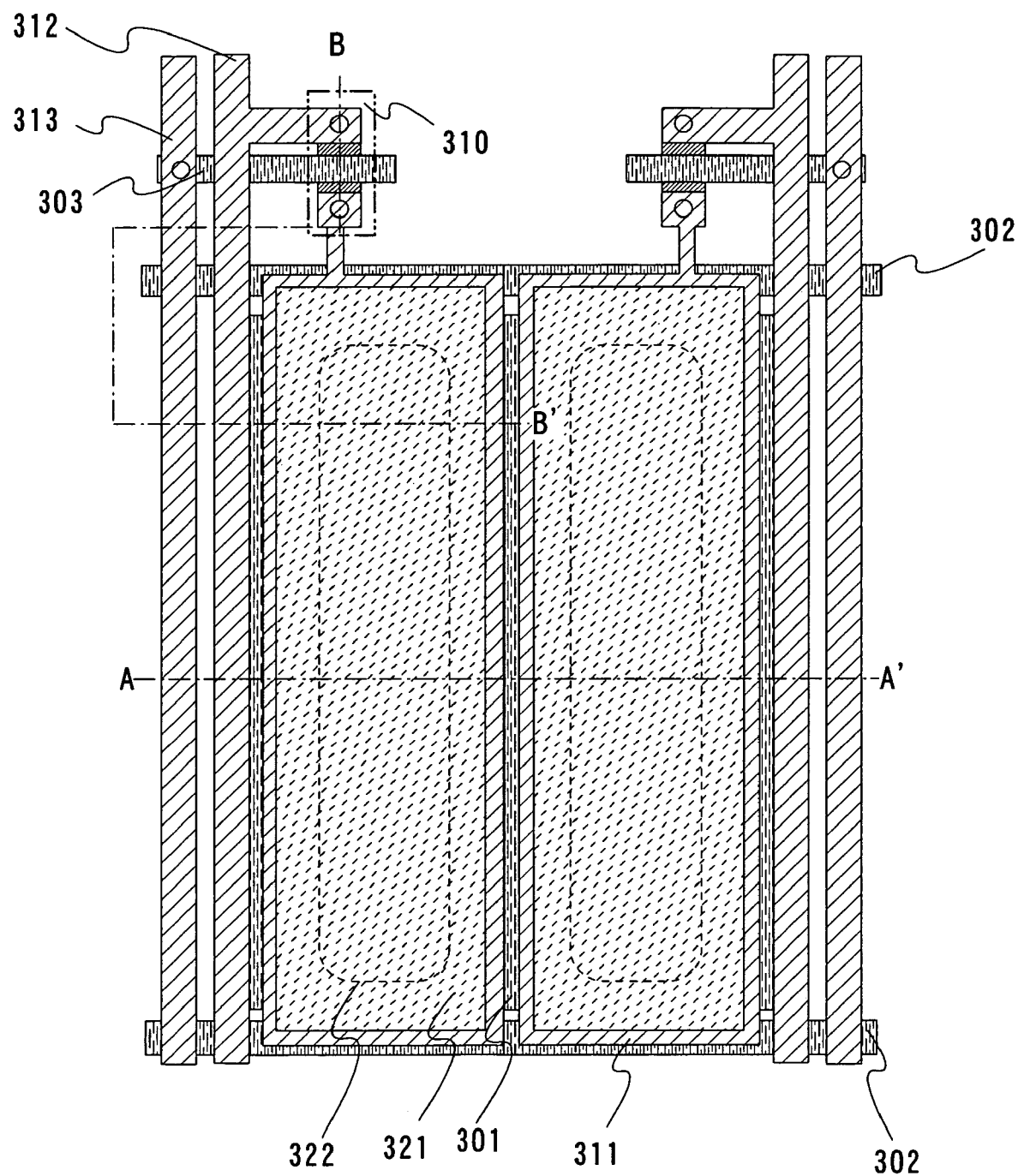
FIG. 3 is a layout chart of a monitor pixel of the present invention.
Figure 4A:
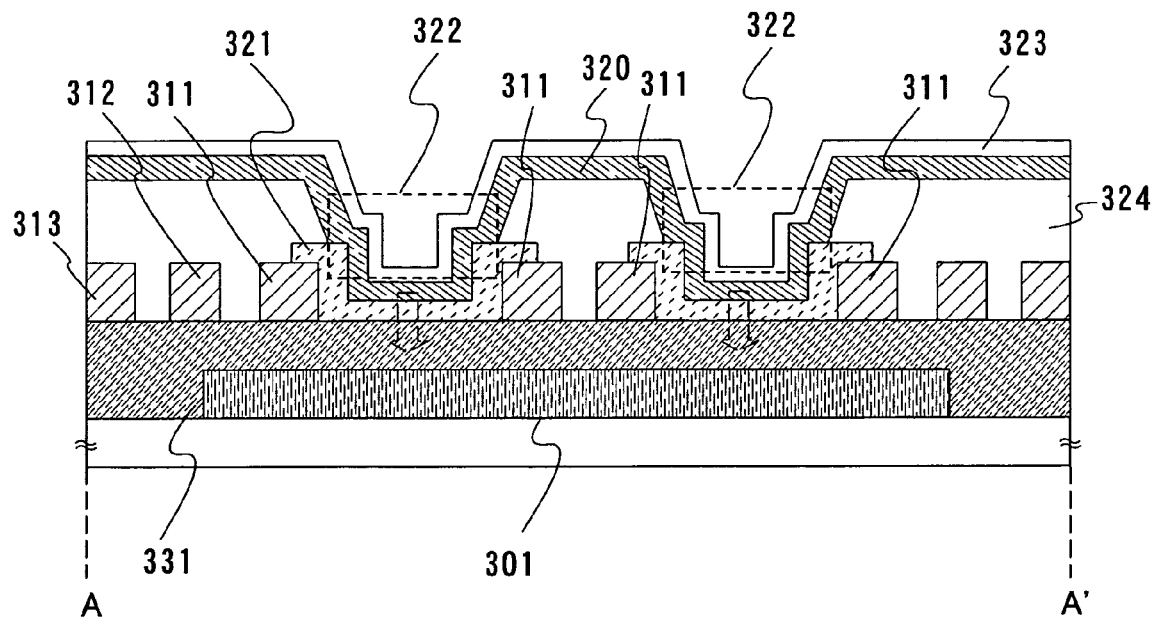
FIGS. 4A-4B are diagrams showing a cross sectional structure of a monitor pixel of the present invention.

A layout chart of a region provided with a monitor element is shown in FIG. 3. And the diagram of a cross section structure when taken along a chain-line A-A' is shown in FIG. 4A.

A first light shielding film 301 is a conductive film formed of the same layer as a gate signal line 302 connected to a gate driver. Further, the first light shielding film 301 and the gate signal line 302 are also formed of the same layer as a gate wiring 303 of a TFT 310 for driving the monitor element. And the first light shielding film 301 is provided so as to overlap with a first electrode 321 of the monitor element. The first light shielding film 301 is provided so as not to overlap with at least a gate signal line 302 in a region surrounded by two gate lines 302 and two current supply lines 312. The light shielding film 301 may be provided so as to overlap with a current supply line 312.

A second light shielding film 311 is a conductive film which is formed of the same layer as the current supply line 312 for connecting a source region of the TFT 310 for driving the monitor element to a constant current source. This second light shielding film 311 also functions as a drain electrode of the TFT 310. Further, the second light shielding film 311 and the current supply line 312 are formed of the same layer as a control line 313 applying electric potential to the gate wiring 303 of the TFT 310. The second light shielding film 311 has an annular shape, and is provided so as to cover the outer periphery (outer edge) of the first electrode 321. By providing the second light shielding film 311 in this manner, a region in the first electrode 321 which is not covered with only the first light shielding film 301 can be also covered entirely. Note that a reference numeral 324 is an insulating film (referred to as a bank, a partition, a barrier, a mound, or the like).

The first electrode 321 is one of the electrodes to apply electric potential to an electroluminescent layer 320, and functions as an anode or a cathode. In FIG. 3 and FIG. 4A, a light-emitting region 322 shown by dotted lines is a region where a light-emitting element emits light when electric potential is applied to each of the first electrode 321 and the second electrode 323.

In this embodiment mode, in a bottom emission type display device, more than one monitor elements and driving TFTs are arranged alternately to plural pixels arranged in matrix. Further, the monitor elements and the TFTs for driving the monitor element are provided in different regions from each other with the gate signal lines therebetween. To prevent the leakage of light emitted from the monitor element, the first light shielding film 301 and the second light shielding film 311 are overlapped with the first electrode 321. According to the structure, light shielding of the light generated from the monitor element can be sufficiently achieved.

The first light shielding film 301 and the second light shielding 311 are formed in the same step as a wiring in the case of forming the TFT 310 for driving the monitor element. Therefore, the light shielding film can be formed without unnecessary cost and increasing the number of steps.

Here, a light-emitting element having a bottom emission structure (bottom emission method) and provided in a pixel portion, which is formed over the same substrate as the monitor element portion is described with reference to FIG. 7.

As a material for a first electrode 1302 serving as an anode, a material having a high work function is desirably used. The first electrode 1302 connects with a TFT 1301. For example, a transparent conductive film such as an ITO (indium tin oxide) film and an indium zinc oxide (IZO) film can be used. An anode capable of transmitting light can be formed by using a conductive film having transparency.

As a material used for a second electrode 1304 serving as a cathode, a metal film formed of a material having a low work function (Al, Ag, Li, or Ca, or an alloy of these materials such as MgAg, MgIn, AlLi, CaF2, or calcium nitride) can be used. Accordingly, a cathode which does not transmit light can be formed by using a metal film which reflects light. Note that reference numeral 1303 is an electroluminescent layer.

Figure 7:
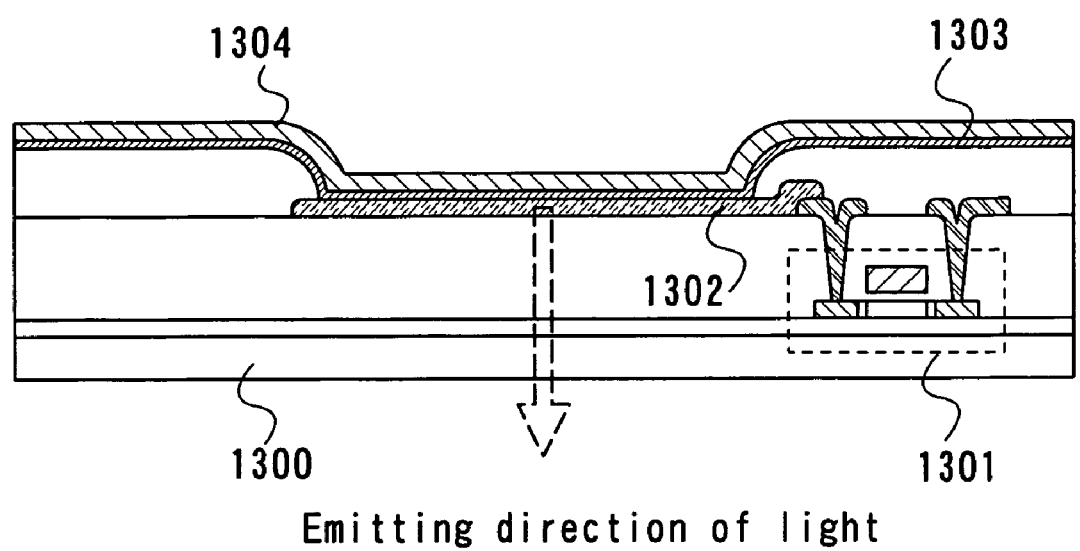
FIG. 7 is a diagram showing a direction of light emission in a display device of the present invention.

Hence, light from the light-emitting element provided in a pixel portion can be taken out downward as shown by an arrow in FIG. 7. When using the light-emitting element having the bottom emission structure provided in the pixel portion for a display device, a substrate having light-transmitting property is used for the substrate 1300. The substrate 1300 may be provided with an optical film when the optical film is to be provided.

Embodiment Mode 2

Figure 4B:
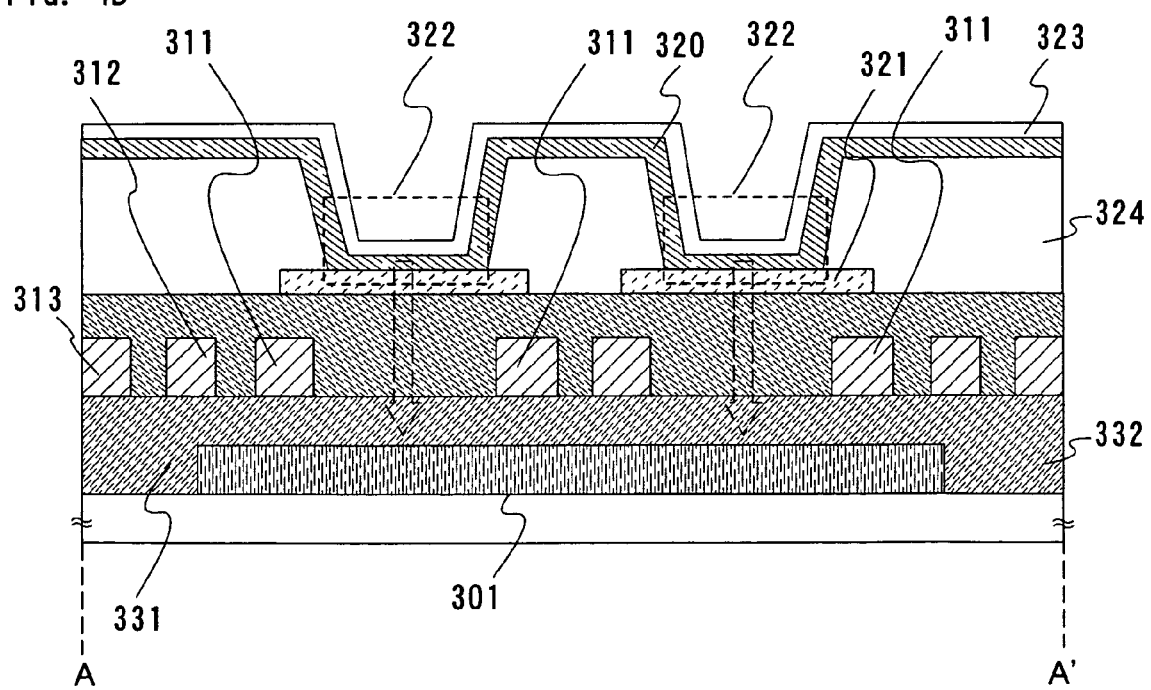

In this embodiment mode, a structure of a display device having a light shielding film in the case of forming two interlayer insulating films in a monitor element portion is described with reference to FIG. 4B. Note that only the point of difference from Embodiment Mode 1 is described in this embodiment mode.

In Embodiment Mode 1, only one interlayer insulating film is formed as shown in FIG. 4A. Therefore, the first electrode 321 is in contact with the second light shielding film 311 over the interlayer insulating film 331. On the other hand, in this embodiment mode, two interlayer insulating films are formed. And an edge of the first electrode 321 is overlapped with a second light shielding film 311 with a second interlayer insulating film 332 interposed therebetween. In FIG. 4B, an example where the second light shielding film 311 has an annular shape is shown; however, this embodiment mode is not limited thereto. When the first electrode 321 and the second light shielding film 311 are overlapped with the second interlayer insulating film 332 interposed therebetween, it is preferable that the second light shielding film 311 at least has such a shape as to block the light in a gap between the first light shielding film 301 and the gate wiring 302. In this embodiment, a region provided with a monitor element and a region provided with a TFT driving the monitor element are also arranged so as not to overlap with each other. Therefore, a structure in which light leakage from the display device to the exterior is prevented can be obtained.

Embodiment Mode 3

In this embodiment mode, a manufacturing step of a monitor pixel portion of a display device is described. A thin film transistor and a light-emitting element provided in the pixel portion of the display device may be formed with the same manufacturing condition and the same manufacturing steps as a thin film transistor and a monitor element provided for the monitor element portion; therefore, description concerning the manufacturing steps of the pixel portion is omitted here.

FIG. 5 and 6 are cross sectional views taken along a chain line B-B' in FIG. 8 which shows a top view. First, as shown in FIG 5A, a base film 102 is formed over an insulating substrate 101. A glass substrate such as barium borosilicate glass or alumino borosilicate glass, a quartz substrate, a ceramic substrate, or the like can be used for the insulating substrate 101. There is a tendency that a substrate formed of a synthetic resin having flexibility such as plastic generally has a lower heat-resistance temperature than the above substrates. However the substrate can be used if it can stand processing temperature in a manufacturing step. Further, the surface of the insulating substrate 101 may be polished by CMP method and planarized.

The base film 102 may be formed by a known method such as a CVD method typified by a plasma CVD method or a low pressure CVD method, or a sputtering method. The base film may have a single-layer structure using any one of a silicon oxide film, a silicon nitride film, a silicon oxynitride film, and a silicon nitride oxide film, or may have an appropriately laminated structure thereof. In this specification, silicon oxynitride refers to a substance having a higher composition ratio of oxygen than that of nitrogen, and can also be referred to as silicon oxide containing nitrogen. In addition, in this specification, silicon nitride oxide refers to a substance having a higher composition ratio of nitrogen than that of oxygen, and can also be referred to as silicon nitride containing oxygen. In this embodiment mode, a silicon nitride oxide film and a silicon oxynitride film are laminated sequentially as the base film.

Subsequently, a semiconductor film 103 is formed over the base film 102. The semiconductor film 103 may be an amorphous semiconductor film. It may alternatively be a microcrystalline semiconductor film or a crystalline semiconductor film. There is no limitation on materials of the semiconductor film; however, silicon or silicon germanium (SiGe) is preferably used. In this embodiment mode, an amorphous silicon film is formed. Note that a step of removing hydrogen contained in the semiconductor film may be performed after forming the semiconductor film.

When the base film 102 and the semiconductor film 103 are formed in such a manner so as not to expose to air an interface between the base film 102 and the semiconductor film 103, contamination of the interface can be prevented and variations in properties of a TFT to be manufactured can be reduced. In this embodiment mode, the base film 102 and the semiconductor film 103 are continuously formed by a plasma CVD method without being exposed to air.

Next, the semiconductor film 103 is crystallized by a known method (a laser crystallization method, a thermal crystallization method, a thermal crystallization method using an element such as nickel which promotes crystallization, or the like) to form a crystalline semiconductor film. Here, after crystallization, the crystalline semiconductor film may be entirely doped with an impurity, such as boron (B), which imparts p-type conductivity of the TFT to perform channel doping on a region to be a channel formation region, thereby controlling threshold voltage of the TFT. In this embodiment mode, a crystalline semiconductor layer formed by crystallizing the semiconductor film 103 is used; however, an amorphous semiconductor film may be used alternately.

Figure 5A:
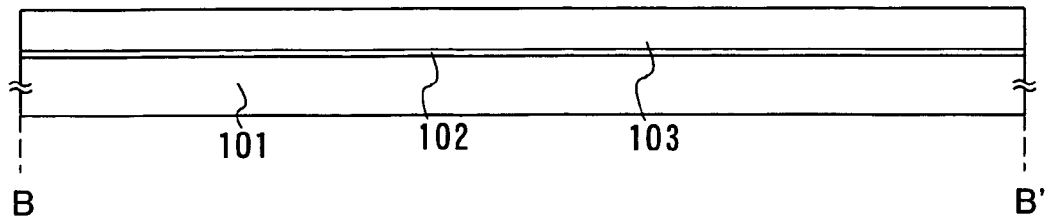
FIGS. 5A-5D are diagrams showing manufacturing steps of a monitor element of the present invention.
Figure 5B:
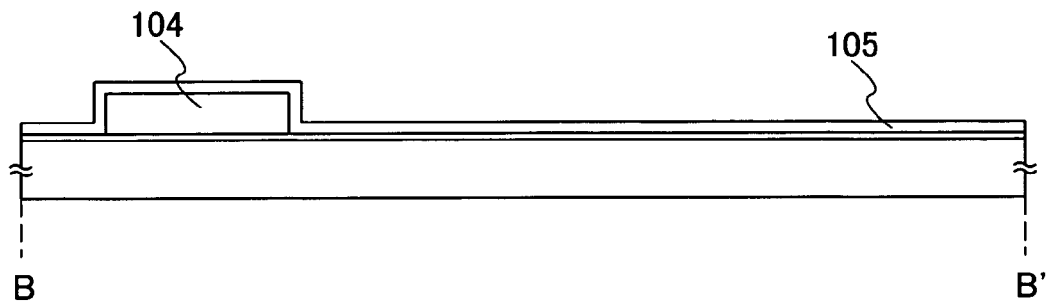
Figure 8D:
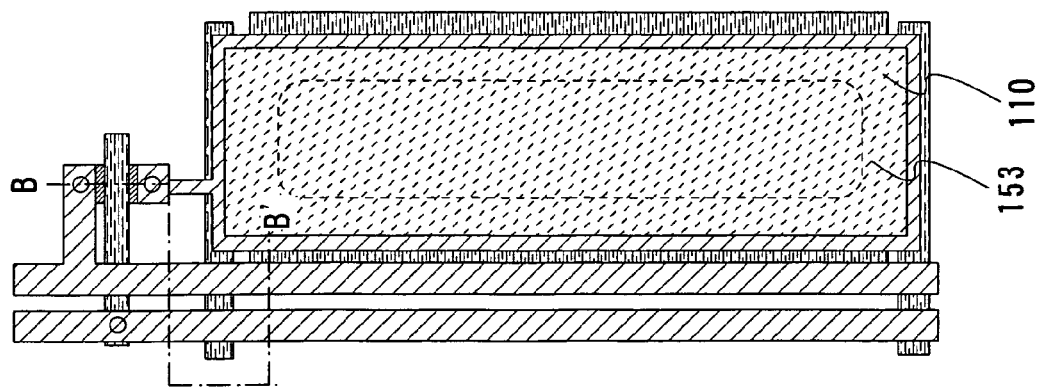
FIGS. 8A-8D are top views showing manufacturing steps of a monitor element of the present invention.
Figure 8C:
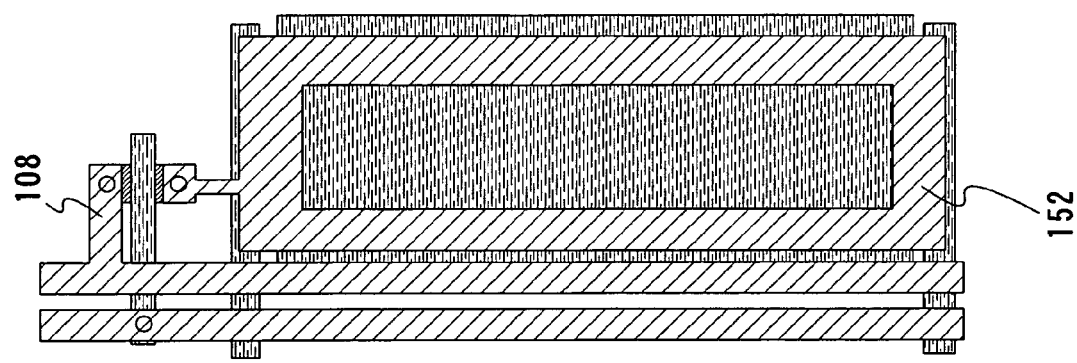

As shown in FIG. 5B, a crystalline semiconductor film is patterned to form a crystalline semiconductor layer 104. Note that FIG. 8A shows a top view of a crystalline semiconductor layer 104 (island semiconductor layer). In this specification, "patterning" means etching into a desired shape.

Then, a gate insulating film 105 is formed over the patterned crystalline semiconductor layer 104. The gate insulating film 105 may have a single-layer structure using any one of a silicon oxide film, a silicon nitride film, a silicon oxynitride film, and a silicon nitride oxide film, or may have an appropriately laminated structure thereof.

Figure 5C:
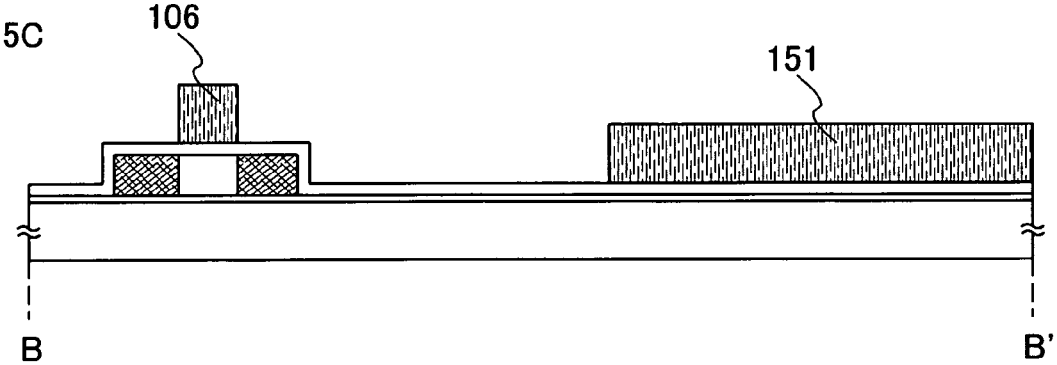
Figure 8B:
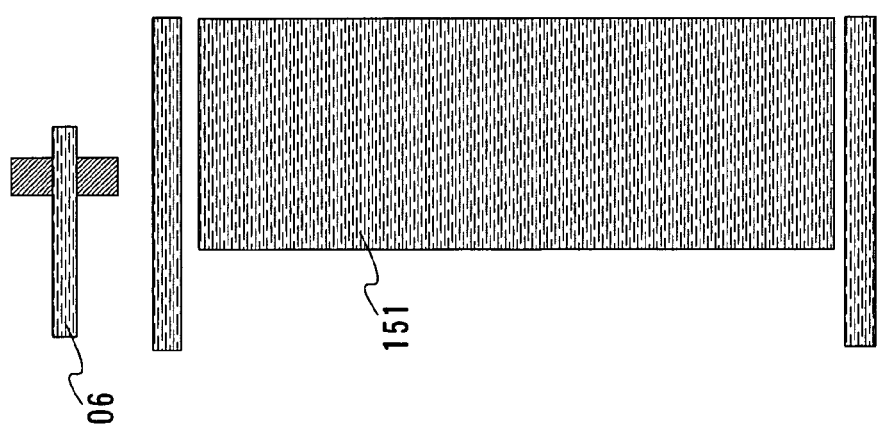
Figure 8A:
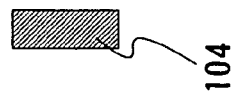

Then, as shown in FIG. 5C and FIG. 8B, a gate electrode 106 and a gate wiring 107 are formed over the gate insulating film 105, and a first light shielding film 151 is formed at the same time. Note that the first light shielding film 151 is formed so as to overlap with a first electrode 110 which is to be formed in a later step. Further, the first light shielding film 151 is provided for a monitor element portion, but not for a light-emitting element in a pixel portion. As a material for the gate electrode 106 and the first light shielding film 151, at least one kind or a multiple kinds selected from aluminum, molybdenum, titanium, and carbon, is used. At this time, a composition ratio of molybdenum or titanium is preferably 7.0 to 20 atoms %.

Subsequently, the crystalline semiconductor film 104 is doped with an impurity such as boron (B) which imparts p-type conductivity, using the gate electrode 106 as a mask. With this step, a source region and a drain region of the TFT can be formed in a self-aligned manner. In this embodiment mode, a low concentration impurity region (LDD region) is formed between the channel formation region, and the source region and the drain region by a known doping method. However, the low concentration impurity region may not be provided.

After the doping, heat treatment, intense light irradiation, or laser light irradiation may be performed to activate the impurity element added to the impurity region. This can repair plasma damage to the gate insulating film 105 and the interface between the gate insulating film 105 and the crystalline semiconductor layer 104 in addition to activate the impurity element.

Figure 5D:
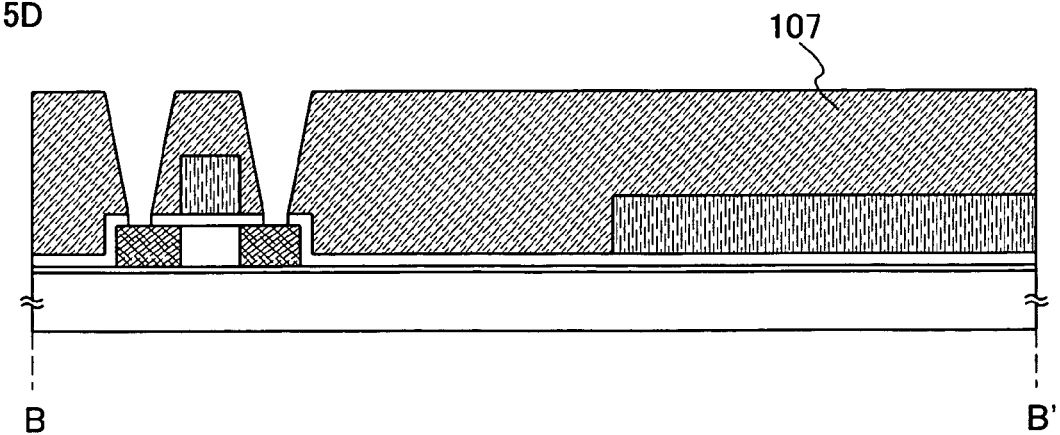

Next, a first interlayer insulating film 107 is formed over the gate insulating film 105 and the gate electrode 106 as shown in FIG 5D. In this embodiment mode, a silicon nitride oxide film and a silicon oxynitride film are sequentially laminated.

After forming the first interlayer insulating film 107, it is preferable to perform a step of hydrogenating the patterned crystalline semiconductor film 104 (semiconductor layer) by performing heat treatment at 300° C. to 550° C. (more preferably, 400° C. to 500° C.) for 1 to 12 hours in a nitrogen atmosphere. With this step, dangling bonds in the semiconductor layer can be terminated by hydrogen contained in the first interlayer insulating film 107. In this embodiment mode, the heat treatment is performed at 410° C. for one hour.

Figure 1A:
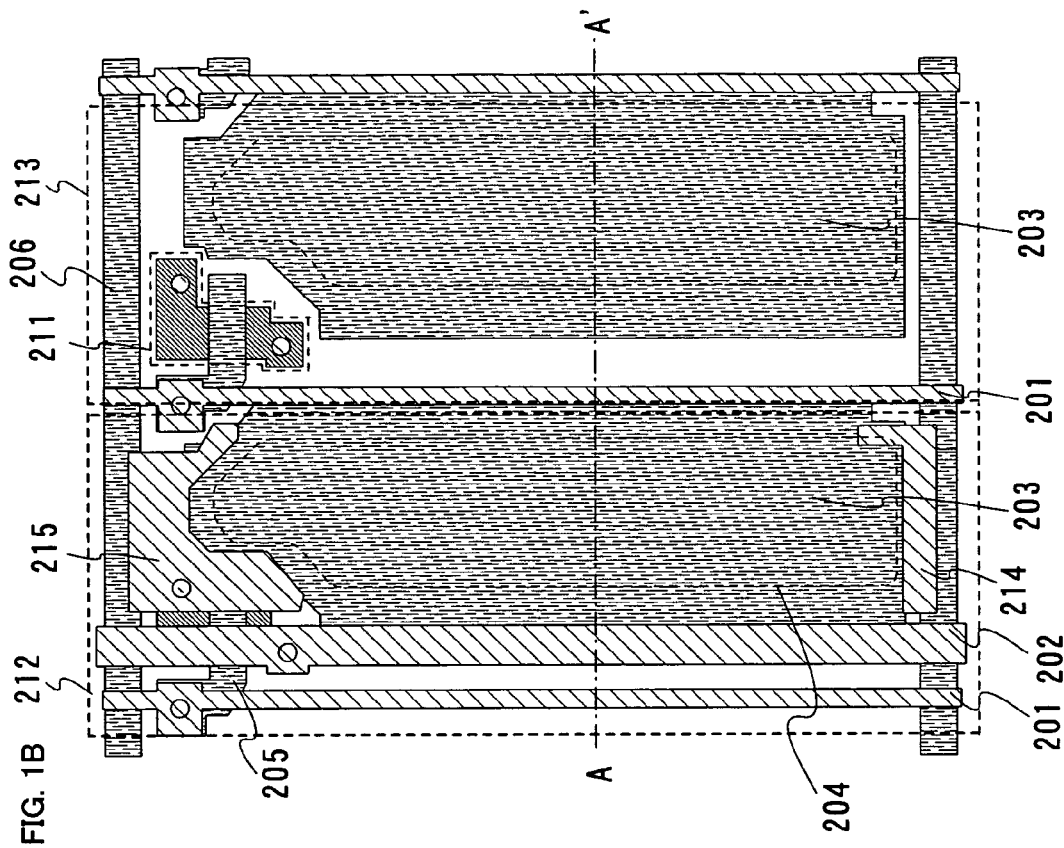
FIGS. 1A-1B are layout charts of a monitor pixel (comparative example).
Figure 1B:
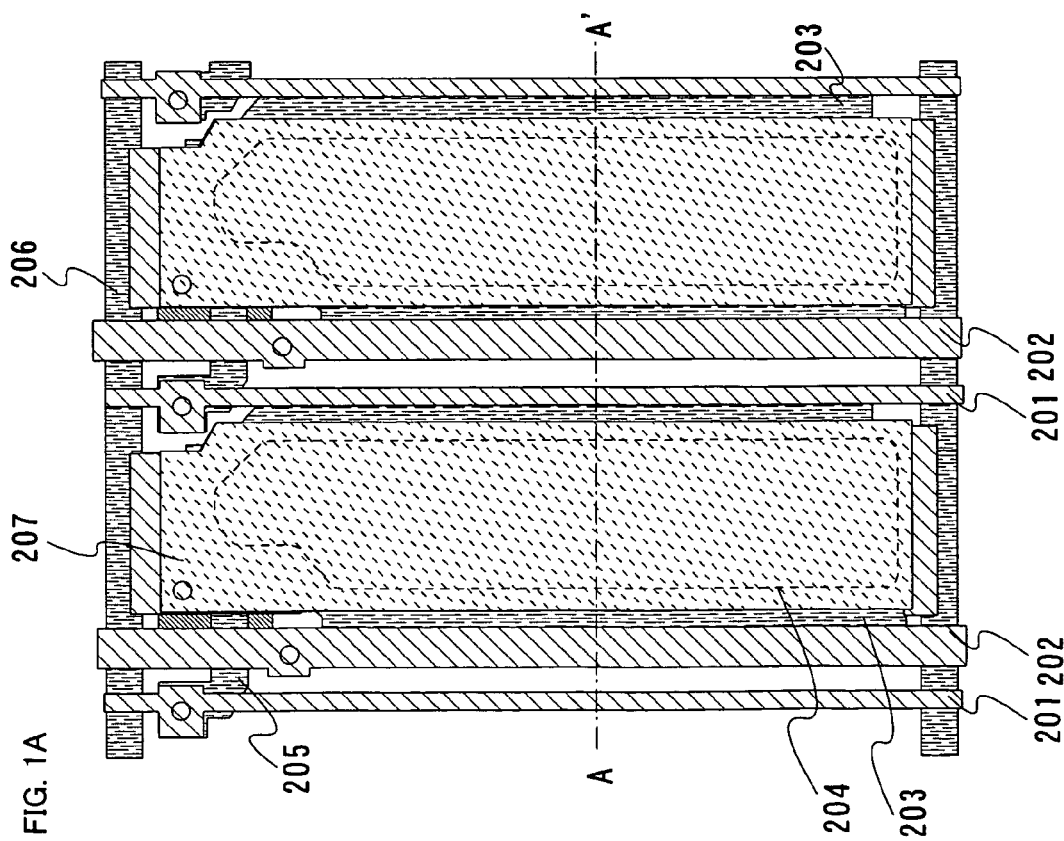
Figure 2:
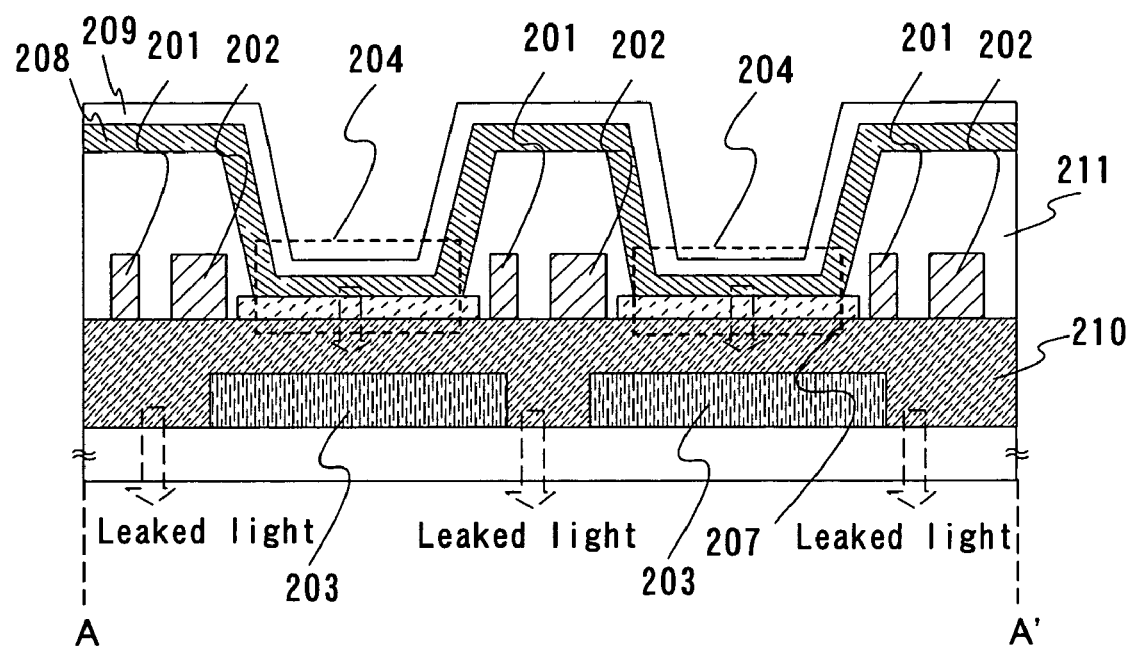
FIG. 2 is a diagram showing a cross sectional structure of a monitor pixel.

Then, a contact hole is formed in the first interlayer insulating film 107 to reach the source region and the drain region of the TFT as shown in FIG. 2A. The contact hole may have a tapered shape.

Figure 6A:
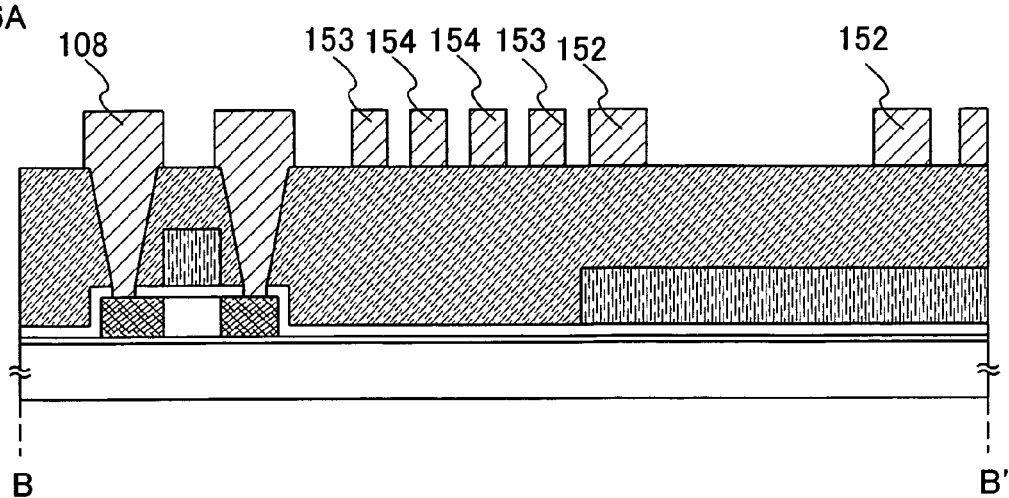
FIGS. 6A-6C are diagrams showing manufacturing steps of a monitor element of the present invention.

As shown in FIG. 6A and FIG. 8C, a wiring 108 is formed to cover the contact hole, and a second light shielding film 152, current supply line 153, and a control line 154 are formed at the same time. The wiring 108 functions as a source electrode and the light shielding film 152 functions not only as a film for light shielding but also as a drain electrode. As shown in a top view of FIG. 8C, the second light shielding film 152 is provided so as to at least overlap with a region between the gate wiring 153 and the first light shielding 151 over the first light shielding 151 when seen from the top surface, and it has an annular shape. The second light shielding 152 is provided for the monitor element, and not for the light-emitting element of the pixel portion.

The wiring 108 and the light shielding film 152 are formed using metal such as Ag, Au, Cu, Ni, Pt, Pd, Ir, Rh, W, Al, Ta, Mo, Cd, Zn, Fe, Ti, Zr, or Ba, an alloy thereof, metal nitride thereof, or a semiconductor material such as Si or Ge. In addition, it may have a laminated structure thereof. In this embodiment mode, a titanium (Ti) film with a thickness of 100 nm, an alloy film of aluminum and silicon (Al—Si) with a thickness of 700 nm, and a titanium (Ti) film with a thickness of 200 nm are formed and patterned into a desired shape.

Figure 6B:
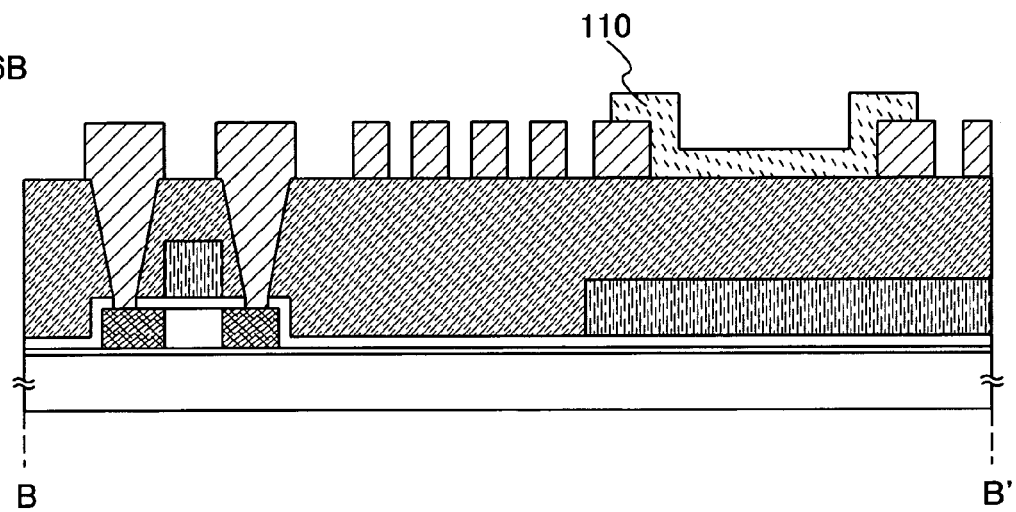

As shown in FIG. 6B and FIG. 8D, the first electrode 110 is formed to be in contact with the first interlayer insulating film 107 and the second light shielding film 152. As shown in a top view in FIG. 8D, the first electrode 110 is provided so as to be arranged over the first light shielding film 151 entirely when seen from its top surface. Further, the edge of the first electrode 110 has a structure that it is in contact with the top surface and a side surface of the second light shielding film 152.

In this embodiment mode, the first electrode 110 is formed using a film with a light transmitting property so as to have a structure in which light emission from a light-emitting element in a pixel portion is taken out from the side of the first electrode 110. Indium tin oxide containing silicon oxide (hereinafter referred to as "ITSO"), zinc oxide, tin oxide, indium oxide, or the like can be used for the first electrode 110. Alternatively, a transparent conductive film such as an indium oxide zinc oxide alloy in which zinc oxide (ZnO) of 2% to 20% is mixed with indium oxide can be used. Other than the above transparent conductive film, a titanium nitride film or a titanium film may be used. In this case, after forming the transparent conductive film, a titanium nitride film or a titanium film is formed to have such a thickness as to transmit light (preferably, approximately 5 nm to 30 nm).

In this embodiment mode, an ITSO film is formed as the first electrode 110 to have a thickness of 110 nm.

The first electrode 110 may be polished by a CMP method or by cleaning with a porous body of polyvinyl alcohol so that the surface thereof is planarized. Furthermore, ultraviolet irradiation or oxygen plasma treatment may be performed on the surface of the first electrode 110 after polishing the surface by the CMP method.

The steps of manufacturing a p-channel TFT are described in this embodiment mode. However, the present invention can also be applied when an n-channel TFT is manufactured by doping the crystalline semiconductor film 104 with an impurity which imparts n-type conductivity, using a gate electrode as a mask. In addition, the invention can also be applied when a p-channel TFT and an n-channel TFT are manufactured over the same substrate.

The TFT may have a single gate structure provided with one channel formation region, a double gate structure provided with two channel formation regions, or a triple gate structure provided with three channel formation regions in a crystalline semiconductor layer 104. A thin film transistor in a peripheral driver circuit region may also have a single gate structure, a double gate structure, or a triple gate structure.

Without limiting to the method for manufacturing the TFT described in this embodiment mode, the present invention can be applied to the method for manufacturing the TFT having a top gate type (planar type), a bottom gate type (inversely staggered type), a dual gate type having two gate electrodes located above and below a channel formation region with a gate insulating film interposed therebetween, or other structure.

Figure 6C:
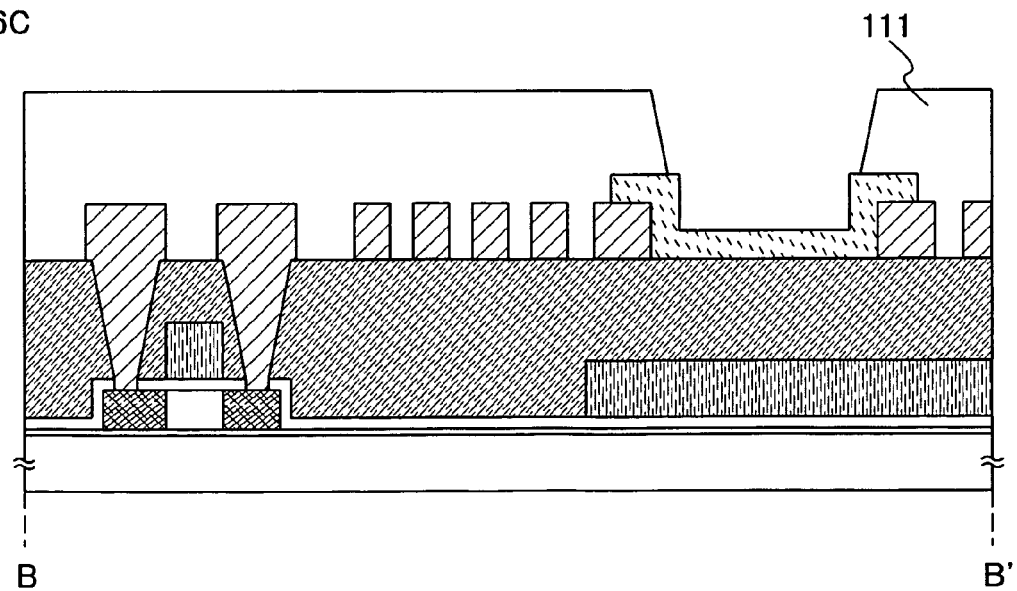

First, as shown in FIG. 6C, an insulating film 111 (referred to as a bank, a partition, a barrier, a mound, or the like) is formed to cover an end of the first electrode 110 and the TFT.

The insulating film 111 can be formed of an inorganic insulating material such as silicon oxide, silicon nitride, silicon oxynitride, aluminum oxide, aluminum nitride, or aluminum oxynitride; acrylic acid, methacrylic acid, or a derivative thereof; a heat-resistant polymer such as polyimide, aromatic polyamide, or polybenzimidazole; an inorganic siloxane-based insulating material including a Si—O—Si bond among compounds that contain silicon, oxygen, and hydrogen and are formed by using a siloxane-based material as a starting material; or an organic siloxane-based insulating material in which hydrogen bonded with silicon is substituted by an organic group such as a methyl group or a phenyl group. It may be formed using a photosensitive or non-photosensitive material such as acrylic or polyimide. In this embodiment mode, the insulating film 111 is formed using photosensitive polyimide with a thickness of 1.5 μm in a planar region.

The insulating film 111 preferably has such a shape that a curvature radius continuously changes, thereby improving the coverage of an electroluminescent layer (a layer containing an organic compound) and a second electrode to be formed over the insulating film 111.

Heat treatment is preferably performed before forming the electroluminescent layer in order to further improve reliability. Moisture contained in or attached to the first electrode 110 or the insulating film 111 is preferably released by the heat treatment.

Figure 10:
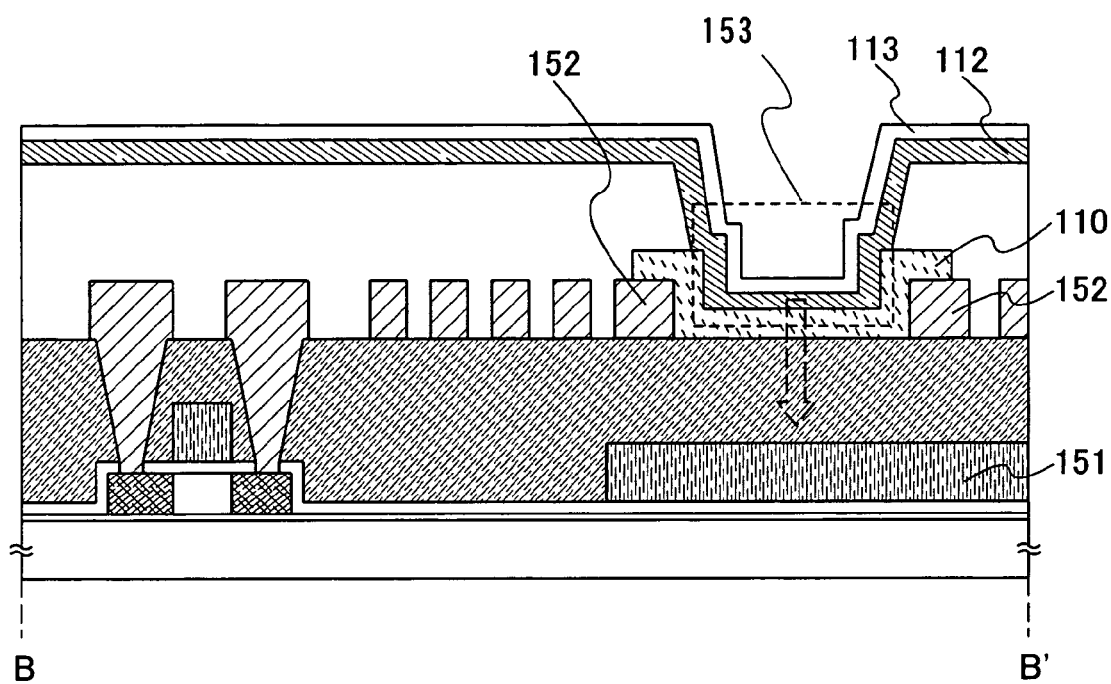
FIG. 10 is a diagram showing a cross sectional structure of a monitor element of the present invention.

Subsequently, as shown in FIG. 10, an electroluminescent layer 112 is formed over the first electrode 110. Note that FIG. 10 corresponds to a cross sectional view taken along chain line B-B' in FIG. 8D. Although only one pixel is shown in FIG. 10, an electric field electrode corresponding to each color of red (R), green (G), or blue (B) are separately formed in this embodiment mode. In this embodiment mode, the electroluminescent layer 112 is formed by selectively forming each material which emits light of red (R), green (G), or blue (B) by an evaporation method using an evaporation mask. Each material which emits light of red (R), green (G), or blue (B) can be selectively formed by an evaporation method using an evaporation mask or by a droplet discharge method. The droplet discharge method has an advantage in that coloring of RGB can be separately performed without using a mask. In this embodiment mode, each material which emits light of red (R), green (G), or blue (B) is formed by an evaporation method.

A known organic light-emitting material or inorganic light-emitting material can be used for the electroluminescent layer. The organic light-emitting material includes a low molecular weight or high molecular weight (polymer) material, however either one can be used. The electroluminescent layer may have a laminated structure freely combining a hole injection layer, a hole transporting layer, a light-emitting layer, an electron transporting layer, or an electron injection layer, or may have a single-layer structure using any one of the layer.

Note that, before evaporating the electroluminescent layer, heat treatment is preferably performed in an atmosphere containing an inert gas as its main component and having an oxygen concentration of 5% or less and a water concentration of 1% or less to remove moisture or the like. In this embodiment mode, the heat treatment is performed at 300° C. for one hour.

Then, the second electrode 113 formed of a conductive film is formed over the electroluminescent layer 112. When the first electrode 110 functions as an anode, the second electrode 113 functions as a cathode; alternatively, when the first electrode 110 functions as a cathode, the second electrode 113 functions as an anode. A material having a low work function (Al, Ag, Li, Ca, or an alloy thereof, that is, MgAg, MgIn, AlLi, CaF2, or CaN) may be used for the second electrode 113.

According to the steps, a monitor element including the first electrode 110, the electroluminescent layer 112, and the second electrode 113 is formed. The region, in which the monitor element is emitted, is shown as a light-emitting region 153 in FIG. 8D. The light-emitting region 153 is blocked by the first light shielding film 151 and the second light shielding film 152 so that a light does not leak from the substrate.

In the display device shown in FIG. 10, light from the monitor element is transmitted through a film formed between the substrate 101 and the first electrode 110, emitted in an arrow direction through the first electrode 110, and blocked with the light shielding films 151 and 152.

It is effective to provide a passivation film so as to cover the second electrode 113. The passivation film can have a single-layer structure or a laminated structure of an insulating film containing silicon nitride, silicon oxide, silicon oxynitride (SiON), silicon nitride oxide (SiNO), aluminum nitride (AlN), aluminum oxynitride (AlON), aluminum nitride oxide having larger nitrogen content than oxygen content, or a nitrogen-containing carbon film (CN). In addition, a material which has a skeleton structure configured by the bond of silicon (Si) and oxygen (O) and includes a material containing at least hydrogen in a substituent or a material containing at least one of fluorine, an alkyl group or aromatic hydrocarbon may be used.

In this case, a film having favorable coverage is preferably used as the passivation film, and it is effective to use a carbon film, particularly, a DLC film. Since the DLC film can be formed at a temperature ranging from a room temperature to 100° C., it can be easily formed over the electroluminescent layer 112 having low heat resistance. The DLC film has a high blocking effect against oxygen and can suppress oxidation of the electroluminescent layer 112. Therefore, a problem of oxidization of the electroluminescent layer 112 during the following sealing step can be prevented.

Subsequently, the substrate 101 formed with the light-emitting element and the monitor element a sealing substrate are fixed by means of a sealant, thereby sealing the light-emitting element and the monitor element. Since the moisture entered from a section can be prevented by the sealant, the light-emitting element can be prevented from deteriorating and reliability of the display device can be increased. Note that a region surrounded by the sealant may be filled with a filler, or nitrogen or the like may be included by sealing in a nitrogen atmosphere. The filler can fill the display device by being dropped in a liquid state. Since the light-emitting element in this embodiment mode is a bottom emission type, a filler with a light transmitting property need not to be used. However, when light is extracted through the filler, the filler needs to be formed using a material with a light transmitting property. One example of the filler is a visible-light curing, ultraviolet curing, or thermosetting epoxy resin. According to the above steps, the display device having the light-emitting element is completed.

The sealant may be an ultraviolet-curing resin, a heat-curing rein, a silicone resin, an epoxy resin, an acrylic rein, a polyimide resin, a phenol resin, a PVC (polyvinyl chloride), PVB (polyvinyl butyral) or EVA (ethylene vinyl acetate). In addition, the sealants may be provided with a filler (spacer in a stick form or fiber form) or a spherical spacer.

In order to prevent the element from deteriorating due to moisture, a drying agent is preferably provided in a display panel. In this embodiment mode, the drying agent is provided in a depression formed in the sealing substrate to surround a pixel region and a monitor element portion, so as not to interfere with thinning. In addition, a water absorption area can be enlarged by also providing a region corresponding to a gate wiring layer with a drying agent, thereby enhancing a water absorption effect. Since the drying agent is formed over the gate wiring layer where light emission of the light-emitting element does not directly affect, the light extraction efficiency is not decreased.

In this embodiment mode, the case of sealing the light-emitting element with a glass substrate is described. Sealing is a process for protecting the light-emitting element from moisture, and is performed using any of the following methods: a mechanical method using a cover member; a method using a thermosetting resin or an ultraviolet curing resin; and a method using a thin film having a high barrier property of metal oxide, metal nitride, or the like. The cover member can be formed of glass, ceramic, plastic, or metal, but when light is emitted through the cover member, the cover member needs to have a light transmitting property. The cover member is attached to the substrate provided with the light-emitting element by means of a sealant such as a thermosetting resin or an ultraviolet curing resin, and the resin is cured by heat treatment or ultraviolet irradiation treatment, thereby forming enclosed space. It is also effective to provide an absorbent typified by barium oxide in this enclosed space. The absorbent may be provided on the sealant, or over the partition or the periphery thereof which does not interfere with light from the light-emitting element. Further, space between the cover member and the substrate provided with the light-emitting element can be filled with a thermosetting resin or an ultraviolet curing resin. In this case, it is effective to add an absorbent typified by barium oxide to the thermosetting resin or the ultraviolet curing resin.

A glass substrate or a plastic substrate is used for a cover material. The plastic substrate may be polyimide, polyamide, an acrylic resin, an epoxy resin, PES (polyether sulfone), PC (polycarbonate), PET (polyethylene terephthalate) or PEN (polyethylene naphthalate) in the form of a plate or a film.

Note that a sealed space is filled with a dried inert gas. A slight amount of moisture in the sealed space surrounded by the sealant is removed by a drying agent, and thus is sufficiently dried. The drying agent may be a substance which absorbs moisture by chemical adsorption such as an oxide of an alkaline earth metal as typified by calcium oxide or barium oxide. Note that a substance which adsorbs moisture by physical adsorption such as zeolite or silica gel may be used as well.

If necessary, a polarizing plate or a circularly polarizing plate (including an elliptically polarizing plate), a retardation film ($\lambda/4$ plate, $\lambda/2$ plate), or an optical film such as a color filter may be appropriately provided for a surface to which light from a light-emitting element is emitted. Further, a polarizing plate or a circularly polarizing plate may be provided with an anti-reflective film. For example, an antiglare treatment which can diffuse reflected light in the depression/projection of the surface, and reduce glare can be performed. Alternatively, an anti-reflection treatment may be performed on a polarizing plate or a circularly polarizing plate by a heat-treatment. Thereafter, a hard coat treatment is preferably performed for protection from external shock.

Embodiment Mode 4

Figure 11:
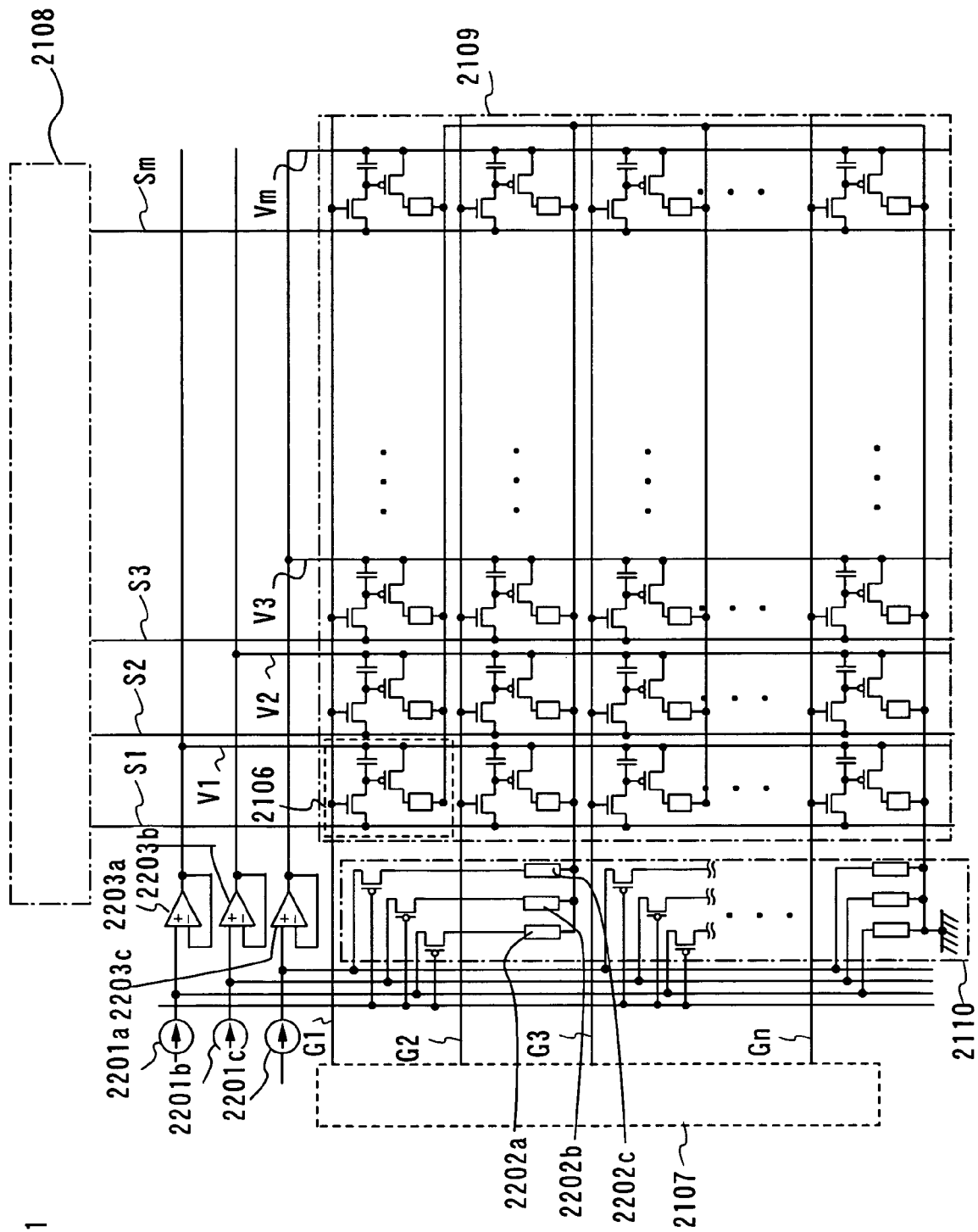
FIG. 11 is a diagram showing a relationship between a pixel portion and a monitor element portion of a display device of the present invention.

In this embodiment mode, a structure of a display device having a light-emitting element provided in a pixel portion and a monitor element provided in a monitor element portion is described with reference to FIG. 11. The display device of this embodiment mode includes a gate driver 2107, a source driver 2108, and a pixel portion 2109. In addition, a monitor element portion 2110 provided close to the side of the pixel portion 2109 is included. In the monitor element portion 2110, monitor elements are provided in three columns in response to each color of R, G, and B. Further, in each column, a column provided with a monitor element and a column provided with a TFT for driving the monitor element are arranged alternately. Namely, each the monitor element and the TFT for driving the monitor element, the number of which corresponds to the half of light-emitting elements in a pixel portion in one column in a matrix is provided. Either an n-channel type TFT or a p-channel type TFT is used for the TFT for driving the monitor element. In this embodiment mode, a p-channel type TFT is used.

In the display device of this embodiment mode, the monitor element provided for the monitor element portion 2110 and the light-emitting element provided for the pixel portion are formed over the same substrate. Namely, the light-emitting element and the monitor element are manufactured with the same manufacturing condition and in the same step, thereby obtaining almost the same properties to the change in ambient temperature and change with time. Since the aperture ratio of the light-emitting element is comparable with that of the monitor light-emitting element portion, the light-emitting element and the monitor element have the same deterioration properties A constant current source 2201a is connected to one electrode (anode) of a monitor element 2202a and a non-inverting input terminal of a voltage follower circuit 2203a. The other electrode (cathode) of the monitor element 2202a is connected to a ground potential. Furthermore, an output terminal of the voltage follower circuit 2203a is connected to one electrode of the light-emitting element with a TFT for driving the light-emitting element provided in the pixel portion 2109 interposed therebetween.

A pixel connected to a signal line S1 is to be a pixel emitting R light, a pixel connected to a signal line S2 is to be a pixel emitting a G light, and a pixel connected to a signal line S3 is to be a pixel emitting B light. The constant current source 2201a supplies current to the monitor element 2202a and the voltage follower circuit 2203a detects electric potential of the anode of the monitor element 2202a, thereby setting the electric potential to a power supply line V1. A constant current source 2201b supplies current to a monitor element 2202b and a voltage follower circuit 2203b detects electric potential of the anode of the monitor element 2202b, thereby setting the electric potential to a power supply line V2. A constant current source 2201c supplies current to a monitor element 2202c and a voltage follower circuit 2203c detects electric potential of the anode of a monitor element 2202c, thereby setting the electric potential to a power supply line V3. According to this structure, electric potential can be set for each color of R, G, or B. Therefore, even if the temperature properties and the degree of the deterioration are different by an EL material of RGB, a desired electric potential can be set to a light-emitting element by color, and electric potential can be corrected by RGB.

Although one of the electrodes of the monitor element connected to the constant current source is described as an anode in this embodiment mode, it may be a cathode. Moreover, although a cathode which is the other one of the electrodes of the monitor element is used as a ground potential in this embodiment mode, it is not limited to this structure.

Embodiment mode 5

In this embodiment, one example of a light-emitting display panel is described with reference to FIG. 12. FIG. 12A is a top view of a panel which is obtained by sealing between a first substrate and a second substrate with a first sealant 1205 and a second sealant 1206. FIG. 12B is a cross-sectional view thereof corresponding to a line A-A' and a line B-B' in FIG. 12A.

In FIG. 12A, reference numeral 1202 is a pixel portion, 1230 is a monitor element portion, and 1203 is a scanning line (gate line) driver circuit each of which is indicated by dotted lines. In this embodiment, the pixel portion 1202, the scanning line driver circuit 1203 and a connection region 1210 are located in the region sealed with the first sealant and the second sealant. The first sealant is preferably an epoxy resin having high viscosity including a filler. On the other hand, the second sealant is preferably an epoxy resin having low viscosity. In addition, the first sealant 1205 and the second sealant 1206 are desirably materials which do not transmit moisture or oxygen.

In addition, a drying agent may be provided between the pixel portion 1202 and the sealant 1205. Further, a drying agent may be provided over the scanning line or the signal line. The drying agent is preferably a substance which absorbs water ($H_2O$) by chemical absorption such as the oxide of alkaline earth metals such as calcium oxide (CaO), and barium oxide (BaO). However, the present invention is not limited to these, and a substance which absorbs water by physical absorption such as zeolite and silica gel may be used as well.

A resin having high moisture permeability in the condition of containing a particulate drying agent may be fixed to the second substrate 1204. As substitute for the resin having high moisture permeability, an inorganic substance such as siloxane polymers, polyimide, PSG (Phosphor Silicate Glass) and BPSG (Boron Phosphorus Silicon Glass) can be also used.

A region overlapped with the scanning line may be provided with a drying agent. Further, the resin having high moisture permeability in the condition of containing a particulate drying agent may be fixed to the second substrate. By providing the drying agent, intrusion of moisture into a light-emitting element and degradation resulting therefrom can be suppressed without decreasing an aperture ratio.

Note that reference numeral 1210 denotes a connection wiring region for transmitting signals inputted to the signal line driver circuit 1201 and the scanning line driver circuit 1203, which receives video signals or clock signals from an FPC (Flexible Printed Circuit) 1209, which is an external input terminal through a connection wiring 1208.

Next, a cross-sectional structure is described with reference to FIG. 12B. Over a first substrate 1200, a driver circuit and a pixel portion are formed, which include a plurality of semiconductor elements typified by TFTs. The signal line driver circuit 1201 as a driver circuit and the pixel portion 1202 are shown here. Note that the signal line driver circuit 1201 is constituted by a CMOS circuit including an n-channel TFT 1221 and a p-channel TFT 1222.

Since the scanning line driver circuit and a TFT in a pixel portion are formed over the same substrate in this embodiment mode, the volume of the light-emitting display device can be decreased.

The pixel portion 1202 is formed of a plurality of pixels including a switching TFT 1211 and a first pixel electrode (anode) formed of a conductive film having light transmitting property which is electrically connected to a driving TFT 1211 and a drain thereof.

In addition, an insulator (also referred to as a bank, partition wall, barrier, mound or the like) 1214 is formed on opposite ends of the first pixel electrode (anode) 1213. In order to increase the coverage of a film formed over the insulator 1214, the insulator 1214 is formed to have a curved surface having curvature on the top end or the bottom end. Further, the surface of the insulator 1214 may be covered with an aluminum nitride film, an aluminum nitride oxide film, or a thin film mainly including carbon, or a protective film formed of silicon nitride film. Note that by using an organic material dissolved with or dispersed with a material which absorbs visible light such as a black colorant and pigment, the stray light of a light-emitting element to be formed later can be absorbed. Therefore, contrast of each pixel can be improved.

Over the first pixel electrode (anode) 1213, an organic compound material is deposited to selectively form an electroluminescent layer 1215. In addition, a second pixel electrode (cathode) 1216 is formed over the electroluminescent layer 1215.

In this manner, a light-emitting element 1217 including the first pixel electrode (anode) 1213, the electroluminescent layer 1215, and the second pixel electrode (cathode) 1216 is formed. The light-emitting element 1217 emits light to the first substrate 1200 side.

In addition, a protective layer 1218 is formed in order to seal the light-emitting element 1217. The protective layer 1218 has stacked layers of a first inorganic insulating film, a stress relaxation film and a second inorganic insulating film. Then, the protective stacked layer 1218 adheres to the second substrate 1204 with the first sealant 1205 and the second sealant 1206. Note that the second sealant is preferably dropped using a system for discharging a composition. After dropping or discharging the sealant from a dispenser to be applied on an active matrix substrate, the second substrate adheres to the active matrix substrate in vacuum condition, and ultraviolet curing is performed; therefore they can be sealed.

An antireflection film 1226 for preventing the reflection of external light at a substrate surface is provided for the surface of the second substrate 1204. Either or both of a polarizing plate and a retardation film may be provided between the second substrate and the antireflection film. By providing the polarizing plate and the retardation film, reflection of external light at the pixel electrode 1213 can be prevented. By forming the first pixel electrode 1213 and the second pixel electrode 1216 using a conductive film having a light transmitting property or a conductive film having a translucent property (a property in which about half of emitted light is transmitted), and by forming the interlayer insulating film 1214 using a material which absorbs visible light or an organic material in which a material which absorbs visible light is dissolved or dispersed, each pixel electrode does not reflect external light, and therefore the retardation film and the polarizing plate are not necessarily provided.

The connection wiring 1208 and the FPC 1209 are electrically connected with an anisotropic conductive film or an anisotropic conductive resin 1227. Further, it is preferable that a connecting portion of each wiring layer and the connecting terminal be sealed with a sealing resin. With such a structure, it can be prevented that the moisture enters the light-emitting element from the cross-sectional portion and that it causes the degradation.

Note that the space between the second substrate 1204 and the protective film 1218 may be filled with an inert gas, for example, a nitrogen gas. The prevention of the intrusion of moisture and oxygen can be enhanced.

In addition, the space between the second substrate and the polarizing plate may be provided with a colored layer. In this case, full color display can be performed by providing light-emitting elements capable of white emission in the pixel portion and additionally providing colored layers of RGB. Furthermore, full color display can be performed by providing light-emitting elements capable of blue emission in the pixel portion and additionally providing a color conversion layer or the like. Further, a light-emitting element which emits red, green or blue light may be formed in each pixel and the colored layer may be used in combination as well. Such a display module has high color purity of each RGB, and thus is capable of displaying high-resolution images.

In addition, one or both of the first substrate 1200 and the second substrate 1204 may be formed using a film, a resin substrate or the like to form a light-emitting display module. By sealing without using a counter substrate in such a manner, weight saving, downsizing and slimming of the display device can be achieved.

Furthermore, a light-emitting display module may be formed by providing an IC chip such as a controller, a memory, and a pixel driver circuit for a surface or an edge of an FPC (flexible printed wiring) 1209 to be an external input terminal.

This embodiment mode can be combined with any one of Embodiment Mode 1 to Embodiment mode 4.

Embodiment Mode 6

The display device of the present invention can be used for a display portion of various electronic devices. In particular, the display device of the present invention is desirably used for mobile devices required to be thin and light.

Examples of electronic devices using the display device manufactured according to the present invention can be given as follows: a television apparatus (referred to as simply TV, television, or television set), a camera (a video camera, a digital camera, or the like), a goggle type display, a navigation system, an audio reproducing device (car audio, an audio component, or the like), a computer, a game machine, a portable information terminal (a mobile computer, a cellular phone, a portable game machine, an electronic book, or the like), an image reproducing device including a recording medium (specifically, a device capable of processing data in a recording medium such as a digital versatile disc (DVD) or Blue-ray Disc and having a display that can display the image of the data), and other electronics each having a display portion. Practical examples of these electronic devices are shown in FIG. 9.

Figure 9A:
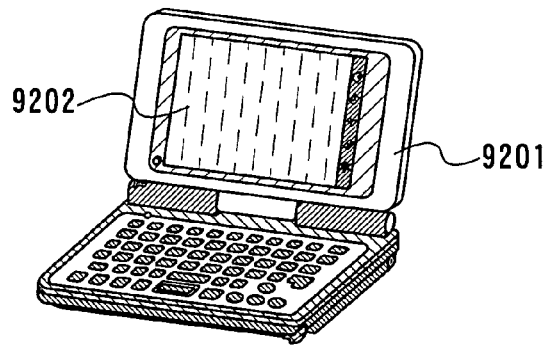
FIGS. 9A-9F are diagrams showing electric devices equipped with a display device of the present invention.

A portable information terminal shown in FIG. 9A includes a body 9201, a display portion 9202, and the like. Those shown in embodiment modes 1 to 6 can be applied to the display portion 9202. Using the display device of the present invention, the portable information terminal having high reliability can be provided at low cost.

Figure 9B:
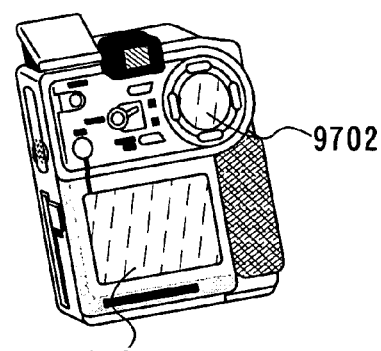

A digital camera shown in FIG. 9B includes a display portions 9701 and 9702, and the like. Those shown in embodiment modes 1 to 6 can be applied to the display portion 9701. Using the display device of the present invention, the digital video camera having high reliability can be provided at low cost.

Figure 9C:
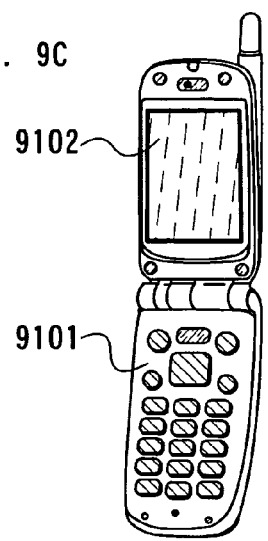

A portable terminal shown in FIG. 9C includes a body 9101, a display portion 9102, and the like. Those shown in embodiment modes 1 to 6 can be applied to the display portion 9102. Using the display device of the present invention, the portable terminal having high reliability can be provided at low cost.

Figure 9D:
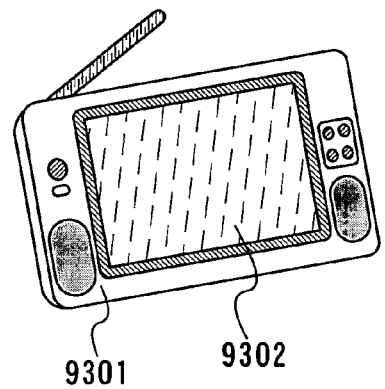
Figure 9E:
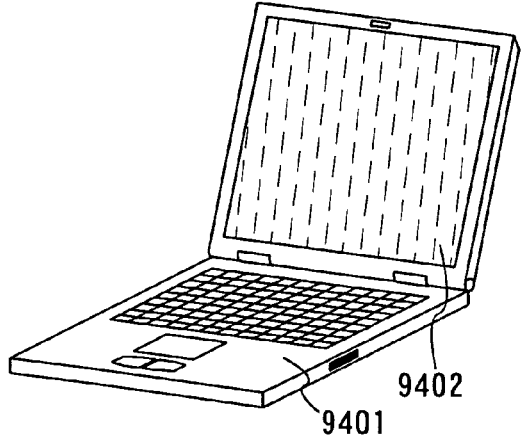

A portable television apparatus shown in FIG. 9D includes a body 9301, a display portion 9302, and the like. Those shown in embodiment modes 1 to 6 can be applied to the display portion 9302. Using the display device of the present invention, a portable television apparatus having high reliability can be provided at low cost. Such a television apparatus can be widely applied to the one in a small size for mounting on a portable terminal such as a cellular phone, the one in a middle size which can be a portable object, and the one in a large size (for example, 40 inches or more).

A portable computer includes a body 9401, a display portion 9402, and the like. Those shown in embodiment modes 1 to 6 can be applied to the display portion 9502. Using the display device of the present invention, a portable computer having high reliability can be provided at low cost.

Figure 9F:
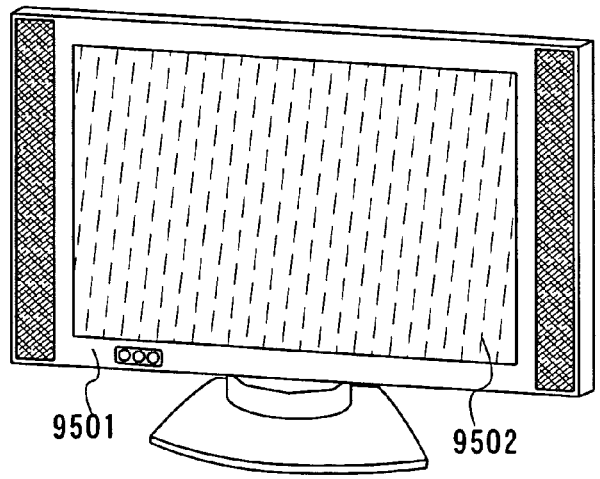

A television apparatus shown in FIG. 9F includes a body 9501, a display portion 9502, and the like. Those shown in embodiment modes 1 to 6 can be applied to the display portion 9502. Using the display device of the present invention, a television apparatus having high reliability can be provided at low cost.

The display device of the present invention can be also used for a front type or a rear type projector.

As described above, the present invention can be applied widely, and used in an every field of electronic devices.

The invention claimed is:

1. An active matrix type display device comprising:
   a pixel portion in which a plurality of pixels including a light-emitting element and a first thin film transistor for driving the light-emitting element are arranged in a matrix,
   a monitor element including a first electrode, an electroluminescent layer over the first electrode, and a second electrode over the electroluminescent layer;
   a second thin film transistor for driving the monitor element;
   a constant current source for applying current to the monitor element; and
   an amplifier,
   wherein the constant current source is electrically connected to one of a source and a drain of the second thin film transistor,
   wherein the other one of the source and the drain of the second thin film transistor is electrically connected to one of electrodes of the monitor element,
   wherein one of the electrodes of the light-emitting element is connected to an output of the amplifier with the first thin film transistor interposed therebetween,
   wherein the monitor element and the second thin film transistor are provided so as not to be overlapped with each other,
   wherein a first light shielding film is provided so as to be overlapped with a first electrode of the monitor element, and
   wherein a second light shielding film is provided so as to be overlapped with an edge of the first electrode.

2. An active matrix type display device according to claim 1, wherein the second light shielding film has an annular shape.

3. An active matrix type display device according to claim 1, wherein the display device is a bottom emission type or a dual emission type display device.

4. An active matrix type display device according to claim 1, wherein the amplifier is a voltage follower.

5. An active matrix type display device according to claim 1, wherein the monitor element and the thin film transistor for driving the monitor element are provided close to the pixel portion.

6. An active matrix type display device according to claim 1, wherein the pixel portion includes a plurality of pixels emitting red (R), a plurality of pixels emitting green (G), and a plurality of pixels emitting blue (B), and the monitor element and the thin film transistor for driving the monitor element are provided for each emission color.

7. An active matrix type display device according to claim 1, wherein the monitor element and the light-emitting element are EL elements.

8. An active matrix type display device according to claim 1, wherein the monitor element and the light-emitting element are formed using a same material in a same step with each other.

9. An active matrix type display device according to claim 1, wherein the active matrix type display device is incorporated in a television apparatus, a camera, a goggle type display, a navigation system, a sound reproducing device, a computer, a game machine, a mobile computer, a cellular phone, a portable game machine, a portable electronic book, or an image reproducing device comprising a recording medium.

10. An active matrix type display device comprising:
a pixel portion in which a plurality of pixels including a light-emitting element and a first thin film transistor for driving the light-emitting element are arranged in a matrix,
a monitor element including a first electrode, an electroluminescent layer over the first electrode, and a second electrode over the electroluminescent layer;
a second thin film transistor for driving the monitor element;
a constant current source for applying current to the monitor element; and
an amplifier,
wherein the constant current source is electrically connected to one of a source and a drain of the second thin film transistor and an input of the amplifier,
wherein the other one of the source and the drain of the second thin film transistor is electrically connected to one of electrodes of the monitor element,
wherein one of electrodes of the light-emitting element is connected to an output of the amplifier with the first thin film transistor interposed therebetween,
wherein the monitor element portion is provided with a first light shielding film formed of a same material as a gate signal line, an interlayer insulating film formed over the first light shielding film, a second light shielding film formed of a same material as a source signal line and formed over the interlayer insulating film, the first electrode formed over the interlayer insulating film and the second light shielding film; the electroluminescent layer formed over the first electrode, and the second electrode formed over the electroluminescent layer,
wherein the monitor element and the second thin film transistor are provided in different regions from each other with the gate line therebetween,
wherein the first light shielding film is overlapped with the first electrode with the interlayer insulating film therebetween, and
wherein the second light shielding film is overlapped with an edge of the first electrode.

11. An active matrix type display device according to claim 10, wherein the second light shielding film has an annular shape.

12. An active matrix type display device according to claim 10, wherein the display device is a bottom emission type or a dual emission type display device.

13. An active matrix type display device according to claim 10, wherein the amplifier is a voltage follower.

14. An active matrix type display device according to claim 10, wherein the monitor element and the thin film transistor for driving the monitor element are provided close to the pixel portion.

15. An active matrix type display device according to claim 10, wherein the pixel portion includes a plurality of pixels emitting red (R), a plurality of pixels emitting green (G), and a plurality of pixels emitting blue (B), and the monitor element and the thin film transistor for driving the monitor element are provided for each emission color.

16. An active matrix type display device according to claim 10, wherein the monitor element and the light-emitting element are EL elements.

17. An active matrix type display device according to claim 1, wherein the monitor element and the light-emitting element are formed using a same material in a same step with each other.

18. An active matrix type display device according to claim 10, wherein the active matrix type display device is incorporated in a television apparatus, a camera, a goggle type display, a navigation system, a sound reproducing device, a computer, a game machine, a mobile computer, a cellular phone, a portable game machine, a portable electronic book, or an image reproducing device comprising a recording medium.

19. An active matrix type display device comprising a pixel portion provided with a plurality of pixels over an insulating substrate, a source signal line driver circuit, a gate signal line driver circuit, and a monitor element portion,
wherein each of the plurality of pixels includes a light-emitting element including a pair of electrodes, a thin film transistor for driving the light-emitting element, a source signal line into which a signal from the source signal line driver circuit is inputted, and a gate signal line into which a signal from the gate signal line driver circuit is inputted,
wherein the monitor element portion is provided with a first light shielding film formed of a same material as the gate signal line, an interlayer insulating film formed over the first light shielding film, a second light shielding film formed of a same material as the source signal line and formed over the interlayer insulating film, a monitor element including a first electrode formed over the interlayer insulating film and the second light shielding film, an electroluminescent layer formed over the first electrode, and a second electrode formed over the electroluminescent layer, a second thin film transistor for driving the monitor element, a constant current source for applying constant current to the monitor element, and an amplifier,
wherein the constant current source is electrically connected to one of a source and a drain of the second thin film transistor and an input of the amplifier,
wherein the other one of the source and the drain of the second thin film transistor is electrically connected to one of electrodes of the monitor element,
wherein one of electrodes of the light-emitting element is connected to an output of the amplifier with the first thin film transistor interposed therebetween,
wherein the monitor element and the second thin film transistor are provided in different regions from each other with the gate signal line interposed therebetween,
wherein the first light shielding film is overlapped with the first electrode with the interlayer insulating film interposed therebetween, and
wherein the second light shielding film is overlapped with an edge of the first electrode.

20. An active matrix type display device according to claim 19, wherein the second light shielding film has an annular shape.

21. An active matrix type display device according to claim 19, wherein the display device is a bottom emission type or a dual emission type display device.

22. An active matrix type display device according to claim 19, wherein the amplifier is a voltage follower.

23. An active matrix type display device according to claim 19, wherein the monitor element and the thin film transistor for driving the monitor element are provided close to the pixel portion.

24. An active matrix type display device according to claim 19, wherein the pixel portion includes a plurality of pixels emitting red (R), a plurality of pixels emitting green (G), and a plurality of pixels emitting blue (B), and the monitor element and the thin film transistor for driving the monitor element are provided for each emission color.

25. An active matrix type display device according to claim 19, wherein the monitor element and the light-emitting element are EL elements.

26. An active matrix type display device according to claim 19, wherein the monitor element and the light-emitting element are formed of a same material in a same step with each other.

27. An active matrix type display device according to claim 19, wherein the active matrix type display device is incorporated in a television apparatus, a camera, a goggle type display, a navigation system, a sound reproducing device, a computer, a game machine, a mobile computer, a cellular phone, a portable game machine, a portable electronic book, or an image reproducing device comprising a recording medium.

28. A method for manufacturing an active matrix type display device comprising the steps of:

forming a base film over a substrate;

forming a thin film transistor for driving a monitor element by forming a semiconductor layer over the base film, forming a gate insulating film over the semiconductor layer, forming a gate electrode over the gate insulating film, and forming a source region and a drain region by doping the semiconductor layer with an impurity using the gate electrode as a mask;

forming a first light shielding film over the base film;

forming an interlayer insulating film over the gate insulating film, the gate electrode, and the first light shielding film;

forming a source electrode and a drain electrode connected to the source region and the drain region, respectively, over the interlayer insulating film;

forming a second light shielding film over the interlayer insulating film; and forming a monitor element over the interlayer insulating film by forming a first electrode to overlap with the first light shielding film with the interlayer insulating film interposed therebetween, forming an electroluminescent layer over the first electrode, and forming the second electrode over the electroluminescent layer, wherein the gate electrode and the first light shielding film are formed in a same step, wherein the source electrode, the drain electrode, and the second light shielding film are formed in a same step, wherein an edge of the first electrode and the second light shielding film are formed so as to be overlapped with each other, and wherein the monitor element is formed so as not to be overlapped with the thin film transistor for driving the monitor element.

29. An active matrix type display device according to claim 28, wherein the second light shielding film has an annular shape.

30. An active matrix type display device according to claim 28, wherein the display device is a bottom emission type or a dual emission type display device.

31. An active matrix type display device according to claim 28, wherein the monitor element is an EL element.

32. An active matrix type display device according to claim 28, wherein the active matrix type display device is incorporated in a television apparatus, a camera, a goggle type display, a navigation system, a sound reproducing device, a computer, a game machine, a mobile computer, a cellular phone, a portable game machine, a portable electronic book, or an image reproducing device comprising a recording medium.

* * * * *